US012713936B1

(12) United States Patent
Unger et al.

(10) Patent No.: US 12,713,936 B1
(45) Date of Patent: Aug. 18, 2026

(54) CROSS-MESH POWER DISTRIBUTION LAYOUT WITH LOW LOOP INDUCTANCE AND METHOD OF MANUFACTURE

(71) Applicant: Astera Labs, Inc., Santa Clara, CA (US)

(72) Inventors: Nathaniel Unger, San Jose, CA (US); Yiqi Tang, Allen, TX (US)

(73) Assignee: Astera Labs, Inc., Santa Clara, CA (US)

( * ) Notice: Subject to any disclaimer, the term of this patent is extended or adjusted under 35 U.S.C. 154(b) by 605 days.

(21) Appl. No.: 18/114,188

(22) Filed: Feb. 24, 2023

(51) Int. Cl.
*H10W 70/05* (2026.01)
*H10W 70/65* (2026.01)
*H10W 70/685* (2026.01)
*H10W 90/00* (2026.01)

(52) U.S. Cl.
CPC ........... *H10W 70/05* (2026.01); *H10W 70/65* (2026.01); *H10W 70/685* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 6,255,600 B1 * | 7/2001 | Schaper | H05K 1/0289 | 174/255 |
| 6,346,743 B1 * | 2/2002 | Figueroa | H01L 23/642 | 361/306.3 |
| 6,981,230 B1 * | 12/2005 | Lin | G06F 30/367 | 716/115 |
| 2003/0045083 A1 * | 3/2003 | Towle | H01L 24/19 | 257/E23.07 |
| 2008/0313746 A1 * | 12/2008 | Doi | H10D 89/00 | 257/E27.009 |
| 2018/0330993 A1 * | 11/2018 | DeLaCruz | H01L 23/5286 | |
| 2019/0097313 A1 * | 3/2019 | Lee | H01Q 1/273 | |
| 2023/0299044 A1 * | 9/2023 | Collins | H01L 23/642 | 257/659 |

* cited by examiner

*Primary Examiner* — Nicholas J Tobergte
(74) *Attorney, Agent, or Firm* — Shield Intellectual Property PC

(57) ABSTRACT

An electronic system having a mounting substrate with a plurality of mesh layers arranged in alternating order with adjacent power strips and ground strips. The opposite current flow within the alternating strips improves the loop inductance and can result in a low package loop inductance and low parasitic resistance. Increasing mutual inductance by controlling the direction of the current flow can reduce total loop inductance. The electronic components including ball grid array devices in a flip chip configuration can be attached to the mounting substrate to increase performance. The use of a plurality of the mesh layers can improve degassing performance due to the mesh structure, reduce the copper imbalance and help reduce potential warpage of the package.

10 Claims, 13 Drawing Sheets

311
312
336
338
324
370
354
330
314
358
337
311
338
336
322
310
328
320
332
312
326
358

502
508
510
512
516
518
514
520
524
526
522
528

538
510
514
546
542
544
536
534
512
514
540
546
530
532

550
516
542
532

550
516
542
532

532
516
550
538
516
542
552

CROSS-MESH POWER DISTRIBUTION LAYOUT WITH LOW LOOP INDUCTANCE AND METHOD OF MANUFACTURE

TECHNICAL FIELD

Embodiments relate generally to electrical structures for reducing loop inductance in electronic circuit packages and more specifically, to electrical structure with cross-mesh power distribution layouts to reduce loop inductance and parasitic resistance and methods of manufacture.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

The development of electronic circuitry and products has been influenced by the physical and electrical properties of the materials and structures used to form the electronic components and electric circuitry.

Active electronic components require electrical power for proper operation. Electronic components can be mounted on multilayer circuit boards and electrically coupled to power distribution networks having power planes, power traces, ground planes, and ground traces. The size, shape, power levels, and electrical parameters of the power distribution components can have an impact of the operational performance.

Components including nearby conductors, signal traces, power traces, other similar components can electrically interact to produce system noise or other electrical effects. The electrical properties of the electronic components and power distribution components can influence the electrical operating properties of the circuit and result in instability, oscillation effects, signal leakage, reflection, frequency change, and other unintended effects. Reducing the effect of such electrical configurations can reduce unwanted effect and increase the overall efficiency of the circuit operation.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following detailed description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. Overview
2.0. System Overview
3.0. Performance Analysis
4.0. Functional Overview
5.0. Example Embodiments
6.0. Extensions and Alternatives

1.0. OVERVIEW

Approaches, techniques, and mechanisms are disclosed for manufacturing and use of the electronic systems discussed herein including electronic systems with multi-layer components and substrates. The electronic systems can improve performance and reduce electrical operating factors between conductive elements by creating directional current flow structures to compensate for inductance and capacitance factors between and around elements in the multi-layer substrates. By reducing loop inductance between various conductive elements in both electronic packages and the underlying printed circuit boards, operating frequencies can be increased.

According to one embodiment, the system can include a mounting substrate for attaching electronic components, the mounting substrate having several layers including a plurality of mesh layers for reducing loop inductance and parasitic resistance. The layers of the mounting substrate can be layers of insulating material and conductive traces for transporting signals and power. The mesh layers can have alternating power and ground strips that are oriented along one axis and can be oriented at a mesh angle from the other mesh layers.

According to one embodiment, the mesh layers of the mounting substrate can be configured as alternate strips of power and ground strips to reduce loop inductance and improve performance.

According to one embodiment, the mesh layers of the mounting substrate can be configured as alternate strips of power and ground strips with strip protrusions to reduce loop inductance and improve performance.

According to another embodiment, the electrical system can include attaching an electronic components to the mounting substrate. The mounting substrate can include a mesh structure having at least two mesh layers configured with alternating strips of power and ground strips to reduce unwanted loop inductance.

In other aspects, the inventive subject matter encompasses electronic systems configured to carry out the foregoing techniques.

2.0. SYSTEM OVERVIEW

Figure 1:
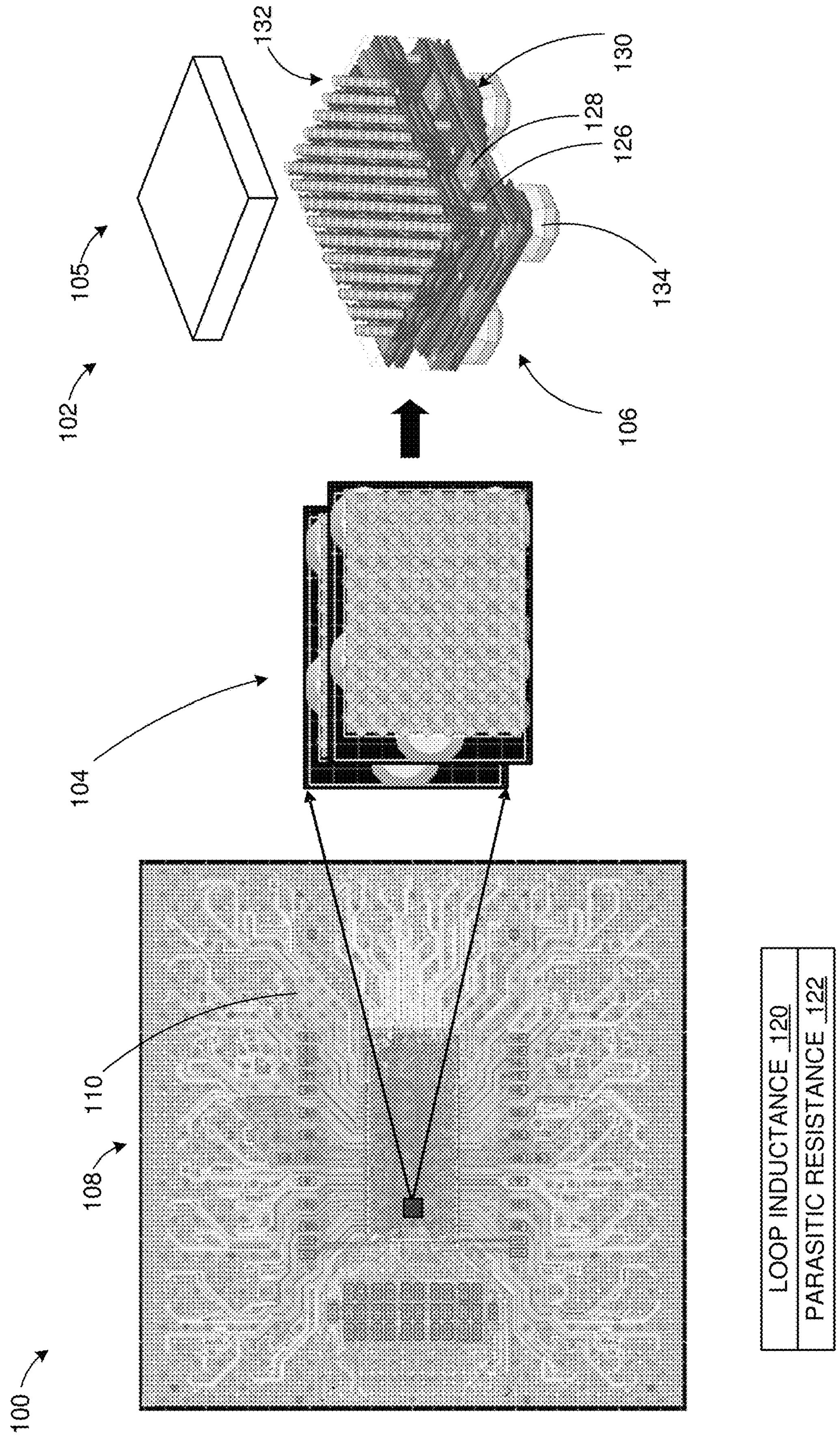
FIG. 1 depicts an embodiment of an electronic system.

FIG. 1 illustrates an example embodiment of an electronic system 100 having an electronic package 102 attached to a mounting substrate 104. The mounting substrate 104 can provide power and connectivity to the rest of the system.

The mounting substrate 104 can include a plurality of package substrate segments 106. The package substrate segments 106 can make up the mounting substrate 104. The package substrate segments 106 can be used to simplify computational analysis.

The mounting substrate 104 is a multilayer structure for attaching electronic components 105, such as ball grid array integrated circuits, to the rest of the electronic system 100. The layers of the mounting substrate 104 can have a variety of configurations. For example, the layers can be a combination of insulating materials and conductive traces or strips for transferring signals or power.

The electronic system 100 can include electronic components on both the electronic package 102 and a printed circuit board 108 (PCB 108) interconnected by conductive traces through the electronic package 102 and the PCB 108. For example, the electronic package 102 can be a flip chip package having one of the electronic components 105 mounted on the mounting substrate 104 and the flip chip package attached to a printed circuit board 108.

The printed circuit board 108 can have a variety of configuration. The PCB 108 can be a multilayer structure having the signal traces 110, power traces, and ground traces on the same or different layers. The layers can be electrically coupled using vertical interconnects such as through board vias, or other similar conductor elements. The layers can include an insulating material, such as a dielectric material, resin, or other similar materials. The layers can include conductive traces formed on the insulating materials. The conductive traces, also known as strips, can include signal traces, power traces, ground traces, or other similar conductive elements.

The electronic package 102 can include one of the electronic components 105 attached to the mounting substrate 104. The electronic package 102 can be attached to the printed circuit board 108. In other embodiments, the mounting substrate 104 can be formed within the printed circuit board 108 and the electronic components 105 can be attached to that portion of the PCB 108.

Thus, in some embodiments, the electronic package 102 and other active and passive components can be attached to the printed circuit board 108. The electronic package 102 and the other components can be electrically coupled to the traces of the printed circuit board 108 in a variety of ways, such as mounted, network linked, soldered, pressure connected, attached with an adhesive, or other similar techniques.

In other embodiments, the electronic package 102, such as a ball grid array package, can be attached to the mounting substrate 104. The connection to the printed circuit board 108 can have a variety of configurations. The electronic package 102 can be attached directly to the printed circuit board 108, such as by soldering the electronic package 102 to the printed circuit board 108.

The mounting substrate 104 can be formed and configured in a variety of ways. The mounting substrate 104 can be a multilayer structure with electrical traces or interconnections for directing signals, electrical power, and ground to different locations on the package. In some embodiments, the mounting substrate 104 can be a printed circuit board or other multilayered structure for conducting signals, power, and ground on different layers. Within the mounting substrate 104, signals, power, and ground can be distributed with the strips 126. The strips 126 are conductive traces on the layers of the mounting substrate.

In some embodiments, the mounting substrate 104 can include a multilayer printed circuit board or equivalent with mounting pads 132 on a top side for a ball grid array package. The mounting substrate 104 can also include base pads 130 for connecting to other external systems such as printed circuit boards. The base pads 130 can be coupled to solder balls 134 for mounting on the lower printed circuit board. The solder balls 134 can be attached to the mounting substrate before attaching the mounting substrate 104 to external systems.

The mounting substrate 104 can have a variety of layers. In some embodiments, the mounting substrate 104 can have layers including signal trace layers, power plane layers, power strip layers, ground planes, ground strip layers, insulation layers, shielding layers, external connection layers, or other similar layers.

The configuration of the circuitry of the electronic system 100 can produce electrical effects that can impact the performance of the electronic system 100. Inductance, resistance, and capacitance are basic elemental properties of all electrical systems.

Inductance is a property of an electric conductor or circuit that causes energy to be stored in the electric field caused by the flow of electrical current in a circuit. It is the tendency of an electrical conductor to oppose a change in the electric current flowing in it. When a circuit is powered, some energy can be used to setup a magnetic field and later the energy can be recovered when the magnetic field dissipates. In general, inductance is greater in longer or wider conductors. Inductance uses the symbol L.

In electronic systems, the amount and distribution of inductance can depend on the configuration of the conductors in the electronic circuit. In modern electronics, different elements can contribute different inductive components depending on the configuration and physical layout of the circuit. This can include the inductive effects of conductive traces and pads on a printed circuit board, active and passive components attached to the printed circuit board, and other electronic components in the system.

Two types of inductance are self-inductance and mutual inductance. Self-inductance can be described as the induction of a voltages in a conductor due to a changing current. The magnetic field created by the changing current can induce a voltage in the same circuit. The voltage is self-induced. Mutual inductance can be described as the inductance produced between different elements.

Loop inductance 120 is the inductance resulting from a loop of conductors. In some embodiments, a completed electrical circuit can have the loop inductance 120.

Other electrical effects can affect the system performance. The mounting substrate 104 can include a power delivery network (PDN) coupled to power rails for powering the electronic package 102. The direct current internal resistance (DC IR) voltage drop and di/dt switching noise can be influenced based on a low package loop inductance (L) and low parasitic resistance (R).

In some embodiments, the electronic package 102 can be a ball grid array package or a flip chip configuration. The electronic package 102 can include the power delivery network with multiple power planes and power distribution traces and strips. The configuration of the power planes can help reduce parasitic inductance and parasitic resistance.

In other embodiments, the power delivery network can be configured with a cross-mesh layout scheme to help improve performance by reducing the parasitic inductance and parasitic resistance and by directing the current flow in a cross-mesh configuration to increase the mutual inductance and thus reduce the total loop inductance. The cross-mesh configuration can have the manufacturing benefits of allowing easier degassing paths and helping to reduce and manage copper imbalance layout issues and reduce warpage risk issues.

The design of the cross-mesh configuration can be performed from the core layers to the top layers to help layout planning and simplify the overall manufacturing process. In some embodiments, samples were analyzed to evaluate the effect of the power delivery network configurations.

The terms traces, strips, and microstrips refer to conductive patterns formed on layers within the electronic system 100 and can be considered interchangeable. The traces, strips, and microstrips form the electrical interconnections of the electronic system 100. The electrical circuits can have properties including the loop inductance 120 and parasitic resistance 122.

FIGS. 2A, 2B, 2C, 2D, 2E, 2F, and 2G illustrate embodiments of a mounting package 202. The mounting package 202 can include an electronic component 205 and a mounting substrate 204.

Figure 2B:
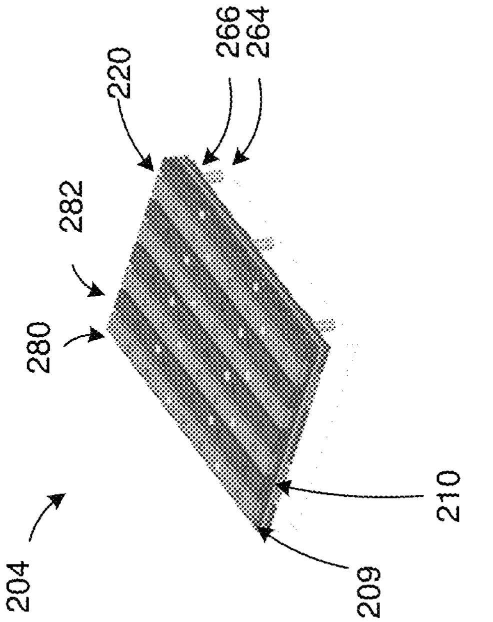
FIG. 2B depicts an example of an embodiment of a mounting substrate.
Figure 2A:
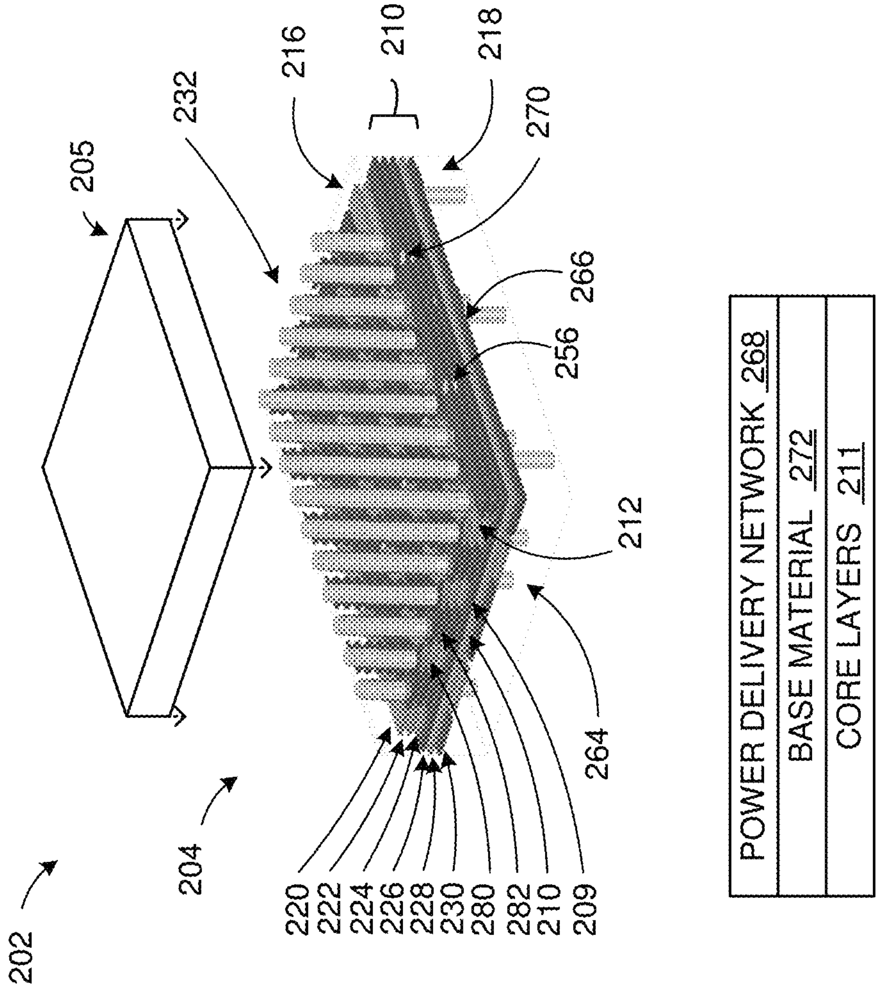
FIG. 2A depicts an example of an embodiment of a mounting package.

FIG. 2A illustrates an embodiment of the mounting package 202. The mounting package 202 can include the electronic component 204 attached to the mounting substrate 204. The mounting substrate 204 can have a variety of configurations. In some embodiments, the mounting substrate 204 can be a multilayer element coupled to mounting pads 266 for attaching to electronic component 205. Each of the layers, such as the layers of a printed circuit board, can include an insulating material and conductive traces or strips. The layers of the mounting substrate 204 can include a first layer 220, a second layer 222, a third layer 224, a fourth layer 226, a fifth layer 228, a sixth layer 230, and other layers as needed. The mounting substrate 204 can have a top layer 216 and a bottom layer 218. In some configurations, the top layer 216 can be the first layer 220 and the bottom layer 218 can be the sixth layer 230, but other configurations are possible depending on the number of layers. Different layers can have different functionality, such as conducting signals, providing power connections, or providing ground connections.

The mounting substrate 204 includes a power delivery network 268. The power delivery network 268 can include layers having conductive strips, traces, micro-strips, power planes, and ground planes.

The layers 210 can be formed from a base material having conductive elements such as strips, traces, planes, pads, or other similar elements. The base material 272 can be an insulating material such as a resin, epoxy, plastic, fiberglass, or other materials.

The mounting substrate 204 can have contact bumps 232 on a top side of the mounting substrate 204. The contact bumps 232 are electrically conductive elements for attaching to the electronic component 205. The contact bumps 232, such as solder pads, can form a solder connection to the electronic component 205.

The layers 210 can have a plurality of openings 270 in the strips 212. The openings 270 can have a variety of configurations. The openings 270 can include opening for vertical channels between layers, outgassing openings, or other similar openings. For example, the openings 270 can include portions of the through package vias 256 for providing connectivity between layers 210. The openings 270 for the through package vias 256 can include a conductive interior portion transporting current vertically.

The layers 210 can include larger ones of the openings 270 that can be combined to form three dimensional volumes within the printed circuit board 108. These openings can be shown as openings on the strips that can extend beyond the width of the strip 212.

The strips, traces, pads, and openings of the mounting substrate can be formed in a variety of ways. For example, the layers can be formed by plating, etching, lithographic techniques, laser removal, 3D printing, additive techniques, subtractive techniques, or other similar techniques.

In some embodiments, the bottom layer 218 can include bottom connectors 264 for distributing signals out from the mounting substrate 204. The bottom connectors 264 can be coupled to solder pads and solder balls for forming an electrical connection to the printed circuit board 108 or other mounting substrates.

The electronic package 102 can be a variety of configurations. For example, the electronic package 102 can have a ball grid array flip chip configuration.

FIG. 2B illustrates an embodiment of a mounting substrate 204. The mounting substrate 204 can include a multilayer structure having a plurality of layers. The layers 210 can include core layers 211. The core layers 211 are interior layers of the mounting substrate 204. The core layers 211 can be thicker than other layers. The core layers 211 can include core vias that can be larger than other vias.

In some embodiments, the mounting substrate 204 can include layers having alternating strips such as alternating power strips 280 and ground strips 282. The mounting substrate 204 can have other layers such as signal layers, power plane layers 210, and ground plane layers 209. Each of the layers, such as the layers of a printed circuit board or other circuit element, can have a different functionality such as signal conducting, providing power connections, and providing ground connections. In some embodiments, the layers can provide a structure for attaching electronic components such as chips, passive components, and/or active components. The layer can include the traces, pads, vias, openings, and other conductive elements.

Figures 2C, 2D, 2E, 2F, 2G:
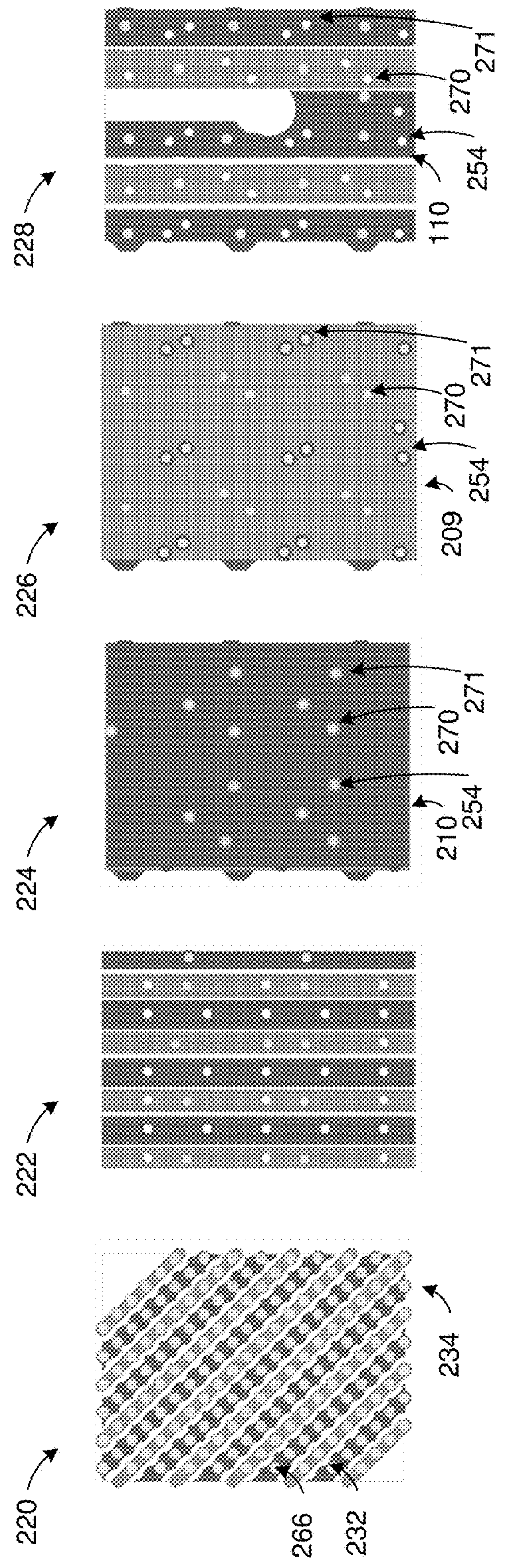
FIG. 2C depicts an example of an embodiment of a first layer of a mounting substrate.
FIG. 2D depicts an example of an embodiment of a second layer of a mounting substrate.
FIG. 2E depicts an example of an embodiment of a third layer of a mounting substrate.
FIG. 2F depicts an example of an embodiment of a fourth layer of a mounting substrate.
FIG. 2G depicts an example of an embodiment of a fifth layer of a mounting substrate.

FIG. 2C illustrates an embodiment of the first layer 220 of the mounting substrate 204. The first layer 220 can include the signal traces 110 coupled to the mounting pads 266 for attaching to the electronic component 205. In an embodiment, the mounting pads 266, such as the solder pads, can be configured to attached to a ball-grid array component.

The first layer 220, such as a top layer, can be configured with the contact bumps 232 and the traces 234 for distributing signals, power, and ground and to electrically couple to the electronic package 102. In some embodiments, the first layer 220 can have an array of the mounting pads 266 that can correspond to the pads of the electronic package 102, such as a ball-grid package. The terms traces, strips, and microstrips refer to conductive patterns formed on layers within the mounting substrate. The traces, strips, and microstrips form the electrical interconnections of the electronic system 100.

The first layer 220 can include the contact bumps 232 and the signal traces 110 for attaching to the electronic component 205. The first layer 220 can include the signal traces 110 for distributing signals, power, and ground connections. In an embodiment, the signal traces 110 can be couple together a plurality of pins. In other embodiments, the signal traces 110 can route signals as needed by for the intended use of the electronic component 205 and the electronic system 100.

FIG. 2D illustrates an embodiment of the second layer 222 of the mounting substrate 204. The second layer 222 can have traces that can be used to distribute signals, power, and ground. The second layer 222 can have a variety of configurations. For example, the second layer 222 can be configured with the strips 212 arranged in alternate strips of power strips and the ground traces.

The strips 212 can have a plurality of the openings 270 in the strips 212. The openings 270 can have a variety of configurations. The openings 270 can include opening for vertical channels between layers, outgassing openings, or other similar openings.

FIG. 2E illustrates an embodiment of the third layer 224 of the mounting substrate 204. The third layer 224 can have a variety of configurations. In an embodiment, the third layer 224 can be a power plane layer 210. The power plane layer 210 can include a large planar area for distributing power. The large planar area can provide capacity to carry large amount of current.

The power plane layer 210 can include the openings 270 for providing vertical connectivity between layers. The openings 270, such as power plane openings, can include portion of the through board vias 254 and can include a conductive element in the interior portion of the openings 270. The openings 270 can also include outgassing openings 271 from the base materials of the layer and other layers.

FIG. 2F illustrates an embodiment of the fourth layer 226 of the mounting substrate 204. The fourth layer 226 can have a variety of configurations. In an embodiment, the fourth layer 226 can be a ground plane layer 209. The ground plane layer 209 can include a large planar area for distributing ground. The large planar area can provide capacity to carry large amount of current.

The ground plane layer 209 can include the openings 270 for providing vertical connectivity between layers. The ground plane openings 270 can include portion of the through board vias 254 and can include a conductive element in the interior portion of the openings 270. The openings 270 can also include outgassing openings 271 from the base materials of the layer and other layers.

FIG. 2G illustrates an embodiment of the fifth layer 228 of the mounting substrate 204. The fifth layer 228 can have traces that can be used to distribute signals, power, and ground. The fifth layer 228 can have a variety of configurations. For example, the fifth layer 228 can be configured with the strips 212 arranged in alternate strips of power strips and the ground traces.

The strips 212 can have a plurality of the openings 270 in the strips 212. The openings 270 can have a variety of configurations. The openings 270 can include opening for vertical channels between layers, outgassing openings, or other similar openings. For example, the openings 270 can include portions of the through board vias 254 for providing connectivity between layers 210. The openings 270 for the through board vias 254 can include a conductive interior portion transporting current vertically. In other embodiments, the layers 210 can include larger openings 270 that can be combined to form three dimensional volumes within the printed circuit board 108.

The signal traces 110 of the fifth layer 228 can have a variety of configurations. In some embodiments, the fifth layer 228 can be configured to have openings or holes to provide access from upper layers to lower layers. The openings 270 can be formed as part of a through package via or other vertical interconnect. The openings 270 can be configured to support outgassing from the layer or other layers.

FIGS. 3A, 3B, 3C, 3D, 3E, 3F, 3G, and 3H illustrate embodiments of a mounting package 302. The mounting package 302 can include an electronic component 305 and a mounting substrate 304.

Figure 3B:
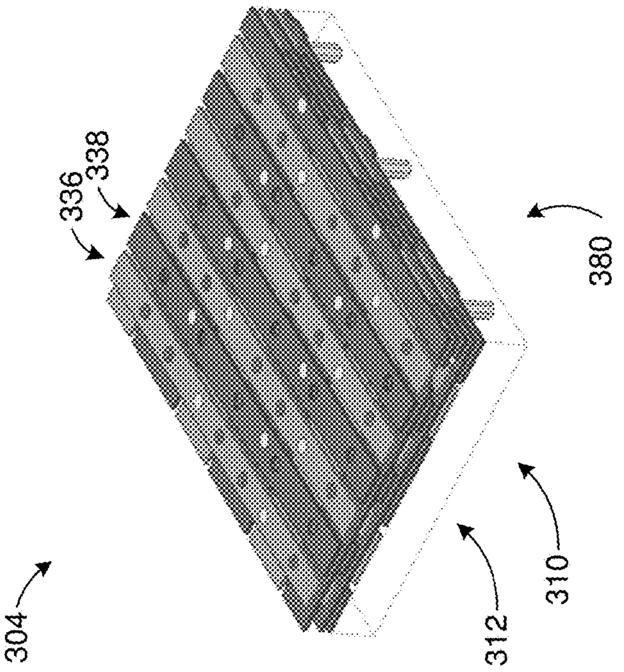
FIG. 3B depicts an example of an embodiment of a mounting substrate.
Figure 3A:
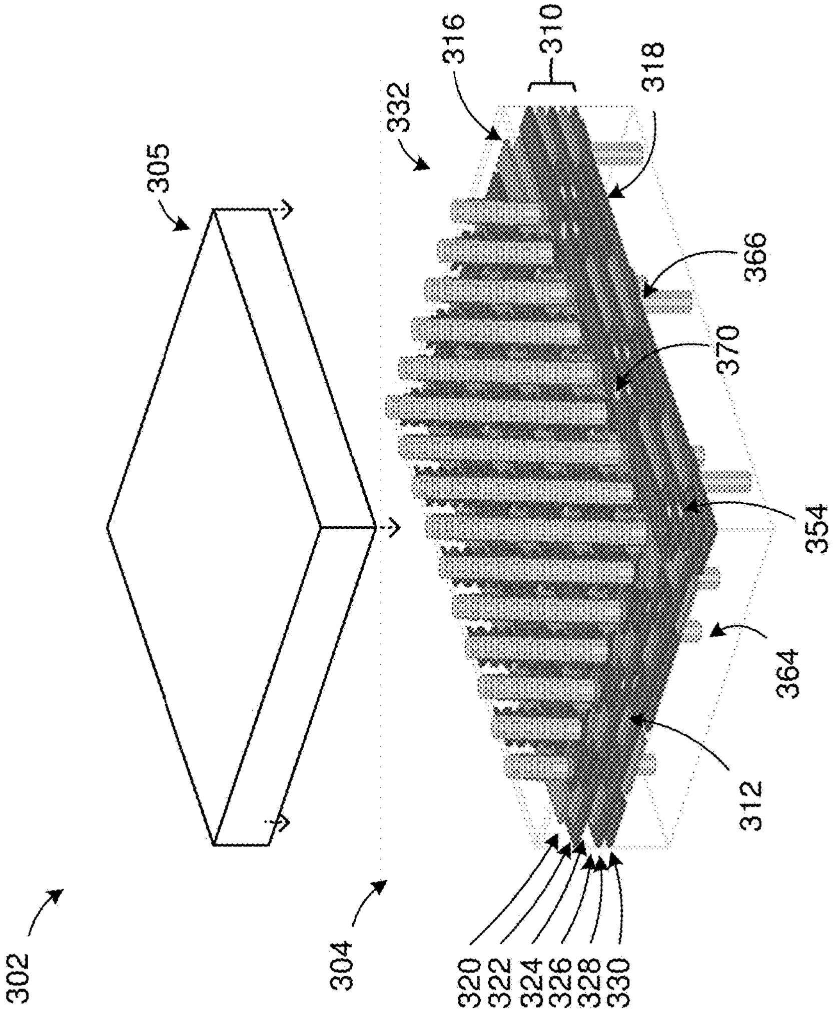
FIG. 3A depicts an example of an embodiment of a mounting package.

FIG. 3A illustrates an embodiment of the mounting package 302. The mounting package 302 can be shown in an isomorphic view showing ball grid contacts on an upper side of the mounting substrate 304 and mounting leads on a bottom side of the mounting substrate 304.

The mounting substrate 304 can have a variety of configurations. In some embodiments, the mounting substrate 304 can be a multilayer element having mounting pads 366 for attaching to electronic component 305. The layers of the mounting substrate 304 can include a first layer 320, a second layer 322, a third layer 324, a fourth layer 326, a fifth layer 328, a sixth layer 330, and a bottom layer 318. In some configurations, the bottom layer 318 can be the sixth layer 330, but other configurations are possible depending on the number of layers. Each of the layers, such as the layers of a printed circuit board or other circuit element, can have a different functionality such as signal conducting, providing power connections, and providing ground connections. In some embodiments, the layers can provide a structure and elements for attaching electronic components such as chips, passive components, and active components. The numbering of the layers can be for identifying multiple layers that can have different functionality.

The mounting package 302 can include contact bumps 332 on a top side of the mounting substrate 304. The contact bumps 332 are electrically conductive elements for attaching to the electronic component 305. The contact bumps 332 can be solder pads for forming a solder connection to the electronic component 305.

Layers 310 can have a plurality of the openings 370 in the strips 312. The openings 370 can have a variety of configurations. The openings 370 can include opening for vertical channels between layers, outgassing openings, or other similar openings. For example, the openings 370 can include portions of the through board vias 354 for providing connectivity between the layers 310. The openings 370 for the through board vias 354 can include a conductive interior portion transporting current vertically. The layers 310 can include larger openings 370 that can be combined to form three dimensional volumes within the printed circuit board 108.

The bottom layer 318 can include bottom connectors 364 for distributing signals out from the mounting package 302. The bottom connectors 364 can be coupled to solder balls for forming a solder connection to a printed circuit board 108.

The electronic package 102 can be a variety of configurations. For example, the electronic package 102 can have a ball grid array configuration.

FIG. 3B illustrates an embodiment of the mounting substrate 304. The mounting substrate 304 can be shown in an isomorphic view showing multiple layers in a cross-mesh configuration with strip oriented differently in each layer.

The mounting substrate 304 can include a mesh structure 380. The mesh structure 380 can include one or more layers 310 having a variety of strips 312 including power strips 336 and ground strips 338.

Figure 3C:
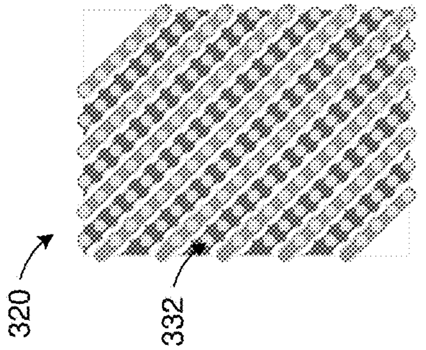
FIG. 3C depicts an example of an embodiment of a first layer of a mounting substrate.

FIG. 3C illustrates an embodiment of the first layer 320 of the mounting substrate 304. A mounting substrate 304 can be formed from a plurality of layers. The different layers can be used to route signals, provide power, provide ground, or a combination thereof. The configuration of the layers can enhance or reduce the electrical properties of the mounting substrate 304.

In some embodiments, the first layer 320 can be a signal conducting layer having a plurality of signal traces 110. The signal traces 110 can also include a variety of configurations. In an embodiment, the signal traces 110 can include at least a first signal trace and a second signal trace. The signal traces 110 can be used to route electrical signals to different locations on the first layer 320.

The signal traces 110 can be coupled to the contact bumps 332, such as solder bumps, pads, connectors, or interconnects for different layers or components. In some embodiments, the bumps 332 can be coupled to other conductors such as a ball grid array or other interconnect technique.

Figure 3D:
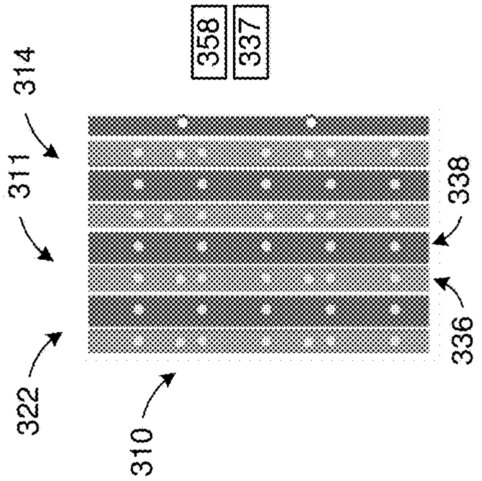
FIG. 3D depicts an example of an embodiment of a second layer of a mounting substrate.

FIG. 3D illustrates an embodiment of the second layer 322 of the mounting substrate 304. The second layer 322 can have a variety of configurations. In some embodiments, the second layer 322 can have a plurality of the strips 312 configured to carry power or ground. The second layer 322 can be described as a mesh layer 311 and can be used to form the mesh structure 380.

The strips 312 are generally flat rectangular conductors that are oriented in parallel along the long direction of the strips 312. The strips 312 can include power strips 336 and ground strips 338. The strips 312 can be arranged with one of the power strips 336 as the first strip 312 from the left when viewed from above. This configuration can be designated as an odd power mesh layer 314.

In another embodiment, the strips 312 can be configured with one of the ground strips 312 as the first strip 312 from the left when viewed from above. This configuration can be designated as an even power mesh layer.

The strips 312 can be configured as power strips 336 and ground strips 338. The power strips 336 are electrically coupled to a power source 337, such as a power rail. The ground strips 338 are electrically coupled to a ground terminal 358, such as a ground rail. In some embodiments, one of the mesh layers can be configured as having power strips, ground strips, power planes, and ground planes. Hybrid mesh layers can be used to accommodate the overall system design. The mesh areas of a hybrid mesh layer can be adjacent to the power and ground plane areas, between the power and ground plane areas, or around the power and ground plane areas.

In some embodiments, the power strips 336 and the ground strips 338 can be arranged in an alternating configuration. Depending on the order of the strips 312, the mesh layer 311 can be and odd power mesh layer 314 or an even power mesh layer 315. In another embodiment, the power strips 336 and the ground strips 338 can have different strip widths and strip separations. In some embodiments, the order of the strips can be irregular, such as two power strips 336 grouped together, two ground strips 338 grouped together, or a missing strip either power or ground. In yet another embodiment, the power strips 336 and the ground strips 338 can have different strip lengths, different widths, and different separations.

Figure 3E:
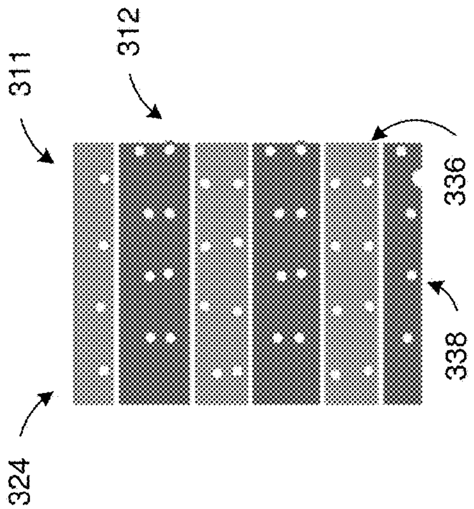
FIG. 3E depicts an example of an embodiment of a third layer of a mounting substrate.

FIG. 3E illustrates an embodiment of the third layer 324 of the mounting substrate 304. The third layer 324 can have a variety of configurations. In some embodiments, the third layer 324 can have a plurality of the strips 312 configured to carry power or ground. The third layer 324 can be described as another of the mesh layers 311 and can be used to form a mesh structure 380.

The strips 312 can be configured as power strips 336 and ground strips 338. The power strips 336 are electrically coupled to a power source 337, such as a power rail. The ground strips 338 are electrically coupled to a ground element, such as a ground rail. In some embodiments, the strips 312 of the third layer 324 can have a horizontal orientation. The strips 312 can have a strip width and a strip length. The strips 312 can be separated from the adjacent strips by a strip separation. The power strips 336 and the ground strips 338 can be arranged in an alternating configuration.

Groups of the mesh layers 311 can form the mesh structure 380. The mesh structure 380 can be a group of the strips 312 and the mesh layers 311 configured to modify the electrical parameters of the electronic system 100.

In an embodiment, the mesh structure 380 can include two of the mesh layers 311 where the mesh layers 311 have a different orientation. In one case, the mesh layers 311 can be orthogonal to one another where one of the mesh layers 311 is vertically oriented and the second of the mesh layers 311 is horizontally oriented. The mesh structure 380 can have a mesh angle 383 of 90 degrees. The mesh angle is the angle of the strips of one of the mesh layers 311. The relative orientation of the two mesh layers 311 can reduce or increase the amount of the loop inductance 120 experienced in the mesh structure 380.

In other embodiments, the mesh structure 380 can have two of the mesh layers 311 where the mesh angle 383 can have different values. Changing the mesh angle 383 can influence the electrical properties of the mesh structure 380. This can include the level of reduction in the loop inductance 120 and the parasitic resistance 122.

In yet other embodiments, the mesh structure 380 can different configurations including having additional mesh layers 311. For example, the mesh structure 380 can have three, four, or more layers.

Figure 3F:
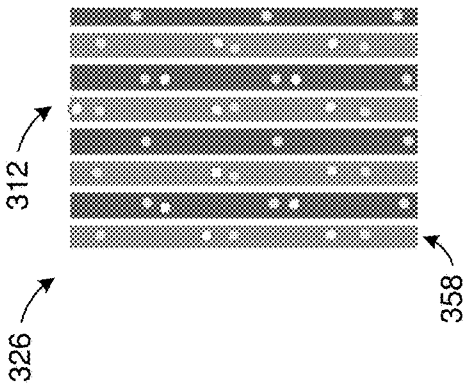
FIG. 3F depicts an example of an embodiment of a fourth layer of a mounting substrate.

FIG. 3F illustrates an embodiment of the fourth layer 326 of the mounting substrate 304. The fourth layer 326 can have a variety of configurations. In some embodiments, the fourth layer 326 can have a plurality of the strips 312 configured to carry power or ground. The fourth layer 326 can be described as one of the mesh layers 311 and can be used to form the mesh structure 380.

The strips 312 are generally flat rectangular conductors that are oriented in parallel along the long direction of the strips 312. The strips 312 can be arranged with a power strip 336 as the first strip 312 from the left when viewed from above. This configuration can be designated as the odd power mesh layer 314.

FIG. 3F illustrates an embodiment of the fourth layer 326 of the mounting substrate 304. The electronic package 102 can include layers reserved for providing a connection to an electrical ground.

The fourth layer 326 can have a variety of configurations. In some embodiments, the fourth layer 326 can be configured to have openings or holes to provide access from upper layers to lower layers. The opening can be formed as part of a through package via or other vertical interconnect.

In some configurations, the fourth layer 326 can be a mesh layer. The ground strip 338 can be configured to reduce electromagnetic emissions and act as an electronic shielding layer.

Figure 3G:
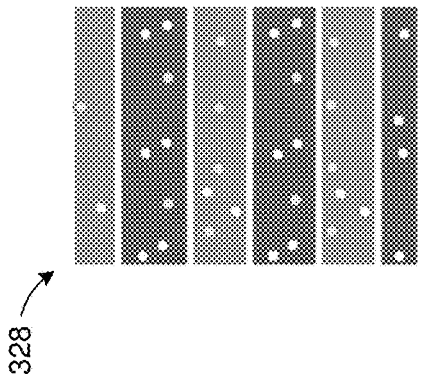
FIG. 3G depicts an example of an embodiment of a fifth layer of a mounting substrate.

FIG. 3G illustrates an embodiment of the fifth layer 328 of the mounting substrate 304. The fifth layer 328 can include the signal traces 110 configured to carry signals, power, or ground. The fifth layer 328 can be the bottom layer 318.

The signal traces 110 of the fifth layer 328 can have a variety of configurations. In some embodiments, the fifth layer 328 can be configured to have openings or holes to provide access from upper layers to lower layers. The openings 370 can be formed as part of a through package via or other vertical interconnect. The openings 370 can be configured to support outgassing from the layer or other layers.

Figure 3H:
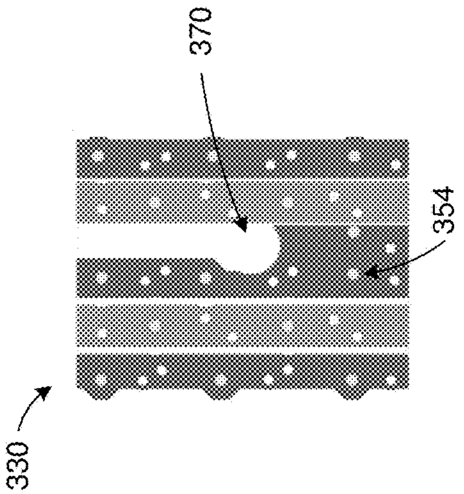
FIG. 3H depicts an example of an embodiment of a sixth layer of a mounting substrate.

FIG. 3H illustrates an embodiment of the sixth layer 330 of the mounting substrate 304. The sixth layer 330 can have traces that can be used to distribute signals, power, and ground. The sixth layer 330 can have a variety of configurations. For example, the sixth layer 330 can be configurated with the strips 312 arranged in alternate strips of power strips and the ground traces.

The strips 312 can have a plurality of the openings 370 in the strips 312. The openings 370 can have a variety of configurations. The openings 370 can include openings for vertical channels between layers, outgassing openings, or other similar openings. For example, the openings 370 can include portions of the through board vias 354 for providing connectivity between layers 310. The openings 370 for the through board vias 354 can include a conductive interior portion transporting current vertically. In other embodiments, the layers 310 can include larger openings 370 that can be combined to form three dimensional volumes within the printed circuit board 108.

The signal traces 110 of the sixth layer 330 can have a variety of configurations. In some embodiments, the sixth layer 330 can be configured to have openings or holes to provide access from upper layers to lower layers. The openings 370 can be formed as part of a through package via or other vertical interconnect. The openings 370 can also be configured to support outgassing from the layer or other layers.

Figure 3I:
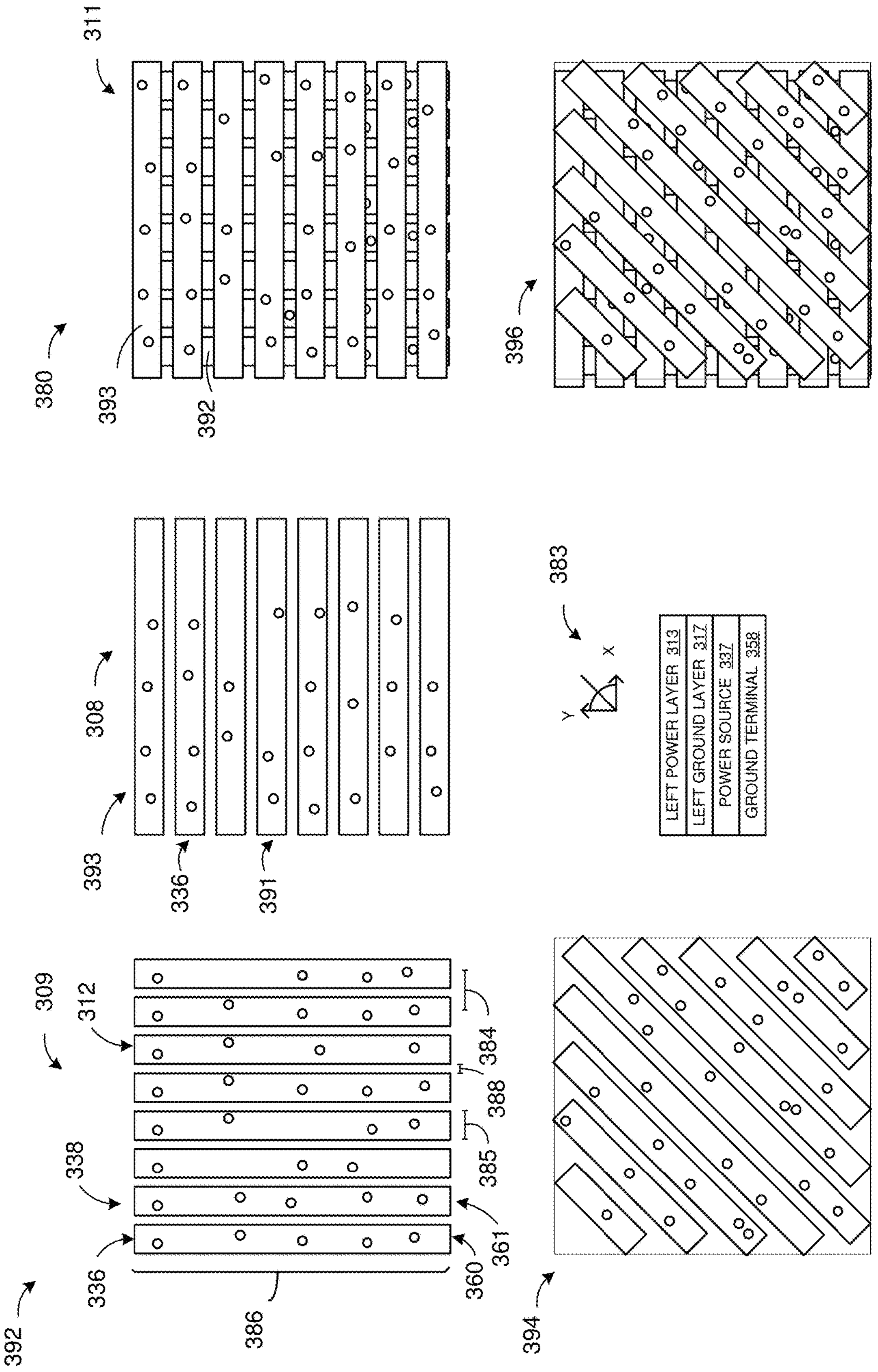
FIG. 3I depicts examples of a mesh structure.

FIG. 3I illustrates embodiments of the mesh structure 380. The mesh structure 380 is a set of the mesh layers 311 that interact to modify electrical performance. Two or more of the mesh layers 311 are located near one another. In some embodiments, the mesh layers 311 are adjacent to one another. In other embodiments, the mesh layers 311 can be separated by a different type of layer 310.

In some embodiments, the mesh structure 380 can include a first mesh layer 309 and a second mesh layer 308. The first mesh layer 309 and the second mesh layer 308 are formed at a mesh angle 383 from one another. The mesh angle 383 is the angle between the primary orientation of each of the two layers. For example, the first mesh layer 309, such as a vertical mesh layer 392, can have a primary orientation 391 of vertical or 90 degrees from the horizontal. The second mesh layer 308, such as a horizontal mesh layer 393, can have a primary orientation of horizontal or 0 degrees. The primary orientation 391 can be the angle along which most of the strips are aligned.

The mesh layers 311 can be configured for power and ground in a variety of ways. In some embodiments each of the odd strips 360 of the mesh layer 311 can be the power strips 336 and be electrically coupled to a positive power source 337. The even strips 361 can be the ground strips 338 and be electrically coupled to the ground terminal 358. This can form an alternating configuration of the power strips 336 and the ground strips 338 of the mesh layer 311 with the leftmost strip configured as one of the power strips 336. This can be designated a left power layer 313.

The odd strips 360 can be determined based on the first leftmost strip as viewed from the top of the mesh layer 311. The even strips 361, such as a second strip 312, which can be the second strip from the left as viewed from the top of the mesh layer 311.

In an alternative embodiment, the odd strips 360 can be ground strips 338 and the even strips 361 can be the power strips 336. This can form an alternating configuration of the power strips 336 and the ground strips 338 with the first leftmost strip being configured as one of the ground strips 338. This can be designated a left ground layer 317.

The mesh structure 380 with two mesh layers 311 can have different configurations, including the permutations and combinations of the first mesh layer 309, the second mesh layer 308, the left power layer 313 and the left ground layer 317. For example, one embodiment can include the first mesh layer 309 configured as the left power layer 313 and the second mesh layer 308 configured as the left ground layer 317. In this configuration, the top left corner can have the ground strip 338 over one of the power strips 336.

In other embodiments, the mesh structure 380 can have different numbers of the mesh layers 311. The mesh structure 380 can be a multiple mesh structure. In some embodiments, the mesh structure 380 can be a triple cross mesh structure and have three of the mesh layers 311. The mesh layers 311 can have an orthogonal orientation between the layers 310. In still other embodiments, the mesh structure 380 can be a quadruple cross-mesh structure with four of the mesh layers 311.

In another embodiment, a multiple mesh structure 396 can have three of the mesh layers 311 including the vertical mesh layer 392, the horizontal mesh layer 393, and a diagonal mesh layer 394. In yet another embodiment, a multiple mesh structure 396 can include two vertical layers and two horizontal layers. Different combinations of the mesh layers 311 can provide different levels of performance and loop inductance reduction.

A set of the strips 312 of the mesh layer 311 can have different properties. For example, the distance between the centers of the strips 312 can be the strip pitch 384. The strip pitch 384 can be measured from center to center or edge to edge of two adjacent ones of the strips 312.

The strips 312 of the mesh layer 311 are separated by a strip separation 388. The strip separation 388 is the distance between adjacent sides of the strips 312. The strips 312 of the mesh layer 311 have a strip width 385 and a strip length 386.

In some embodiments, the electronic system 100 can include the mounting substrate 304 having a plurality of layers, such as mesh layers, configured to reduce overall loop inductance.

The electronic system 100 can include different layers having different electrical properties, layouts, and configurations to modify the electrical properties of the electronic system 100. For example, the layers can include signal trace layers, power layers, grounding layers, or a combination thereof.

In an embodiment, different configuration were evaluated and compared with non-mesh systems. The results in Table 1 show the improvement in the total loop inductance. Using Self-inductance of power strip (L1), Self-Inductance Ground strip (I2), and mutual inductance between the two strips (L1-2) using the equation Loop Inductance=L1+L2−2*(L1-2).

TABLE 1

| Mesh Configuration | | | | | |
|---|---|---|---|---|---|
| Sample | Self-Inductance PWR | Self-Inductance-GND (pH) | Mutual Inductance (pH) | Loop Inductance (pH) | % Improvement |
| Traditional | 91.99 | 71.06 | 39.14 | 84.77 | 18.2% per sample with 40x sample per PKG |
| Mesh PWR | 88.6 | 70.20 | 44.73 | 69.34 | |

In an exemplary embodiment, the mounting substrate 304 can include the first layer 320, the second layer 322, the third layer 324, the fourth layer 326, the fifth layer 328, and the sixth layer 330. The first layer 320 can be positioned on the top level of the mounting substrate 304. Each of the layers, such as the layers of a printed circuit board or other circuit element, can have a different functionality such as signal conducting, providing power connections, and providing ground connections. In some embodiments, the layers can provide a structure for attaching electronic components such as chips, passive components, and/or active components. The layer can include the traces, pads, vias, openings, and other conductive elements. The numbering of the layers can be for identifying multiple layers that can have different functionality.

In some embodiments, using the interleaved power layer 310 can reduce warpage by providing a higher degree of outgassing from both the outgassing openings in the strips 312 and the outgassing between the strips 312 of the mesh layer 311.

The printed circuit board 108 or mounting substrate, can have warpage issues due to the problems with the copper balance of the printed circuit board. The copper balancing addresses the use of copper metal in a printed circuit board. If the use of copper is asymmetrical or irregular it can lead to warpage effects on the printed circuit board 108. This can be due to a variety of reasons and effects including deformation, such as bowing or twisting, as the copper expands and contracts due to temperature changes. This can be due to current flow, heat flow from other components, or other similar factors. The thermal warpage can vary with operation of the system or components, changes in the electrical usage or load over time, manufacturing processes, or other similar actions. Bowing can refer to rounded deformation, such as cylindrical or spherical changes. Twisting can refer to diagonal deformation where opposite corners of an area change their relative positions.

Deformation can cause a variety of problems. In some embodiments, the deformation of the PCB 108 or mounting substrate can cause delamination of the different layers of the printed circuit board 108. Deformation can cause splitting, breakage, cracking, or other similar damaging effects.

The mesh layers 311 can reduce the copper imbalance effects by managing the properties of the copper traces, copper strips, and copper planes. For example, the copper elements can have controlled thickness, improved bonding to the underlying material of each substrate layer, size, and shape to make the copper balance on the printed circuit board layer 310 more uniform.

The mesh layers 311 can reduce the copper imbalance effect by reducing the size of copper areas on the printed circuit board layers. This can be done by replacing large copper areas with the strips having a strip pitch between adjacent strips. Further, the strip separation 388 between each of strips 312 can be sized to reduce copper imbalance effects.

Figure 4:
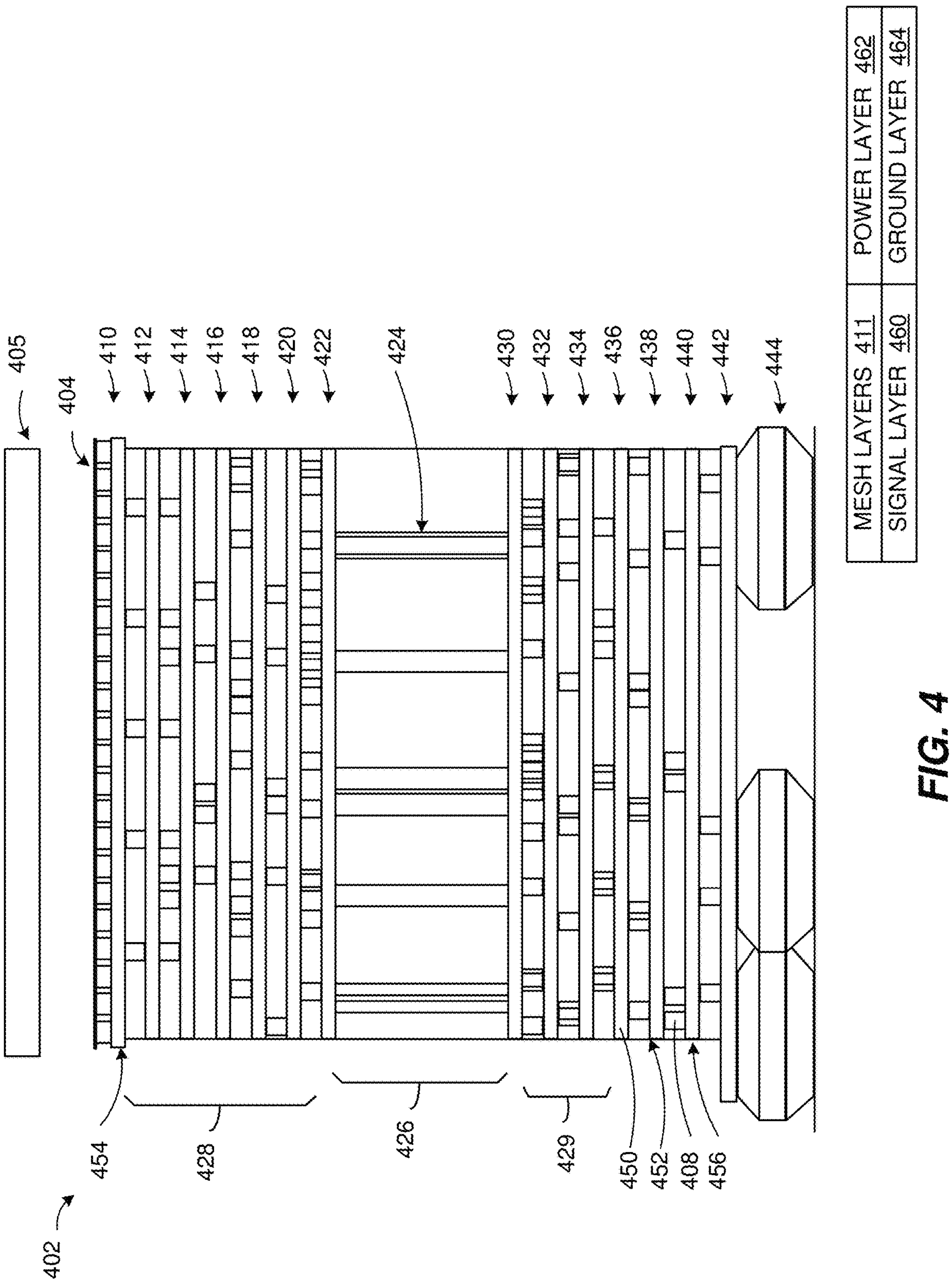
FIG. 4 depicts an example of an embodiment of a mounting substrate.

FIG. 4 illustrates a mounting substrate 402 in an embodiment. The mounting substrate 402 can be formed from a set of the mesh layers 411. An electronic component, such as a die 405, can be attached to the mounting substrate 402.

In some embodiments, the mounting substrate 402 can include a plurality of layers including a top layer 454, a core layer 426, a bottom layer 456 and one or more of a signal layer 460, a power layer 462, and a ground layer 464. An example of the different layers of an embodiment of a mounting substrate 402 is described in Table 2.

TABLE 2

| Package Stack Tiers | | | |
|---|---|---|---|
| Package Stack- | Material Type | Material | Thickness (um) |
| | Solder Mask | SR-1 | 0.018 |
| Top | GND | Copper | 0.015 |
| | Dielectric | GL102F | 0.025 |
| 2 | Signal | Copper | 0.015 |
| | Dielectric | GL102F | 0.025 |
| 3 | GND | Copper | 0.015 |
| | Dielectric | GL102F | 0.025 |
| 4 | Signal | Copper | 0.015 |
| | Dielectric | GL102F | 0.025 |
| 5 | GND | Copper | 0.015 |
| | Dielectric | GL102F | 0.025 |
| 6 | Signal | Copper | 0.015 |
| | Dielectric | GL102F | 0.025 |
| 7 | PWR/GND | Copper | 0.015 |
| | Core | HL832NSFLCA | 0.2 |

TABLE 2-continued

| Package Stack Tiers | | | |
|---|---|---|---|
| Package Stack- | Material Type | Material | Thickness (um) |
| 8 | PWR/GND | Copper | 0.015 |
| | Dielectric | GL102F | 0.025 |
| 9 | Signal | Copper | 0.015 |
| | Dielectric | GL102F | 0.025 |
| 10 | GND | Copper | 0.015 |
| | Dielectric | GL102F | 0.025 |
| 11 | Signal | Copper | 0.015 |
| | Dielectric | GL102F | 0.025 |
| 12 | GND | Copper | 0.015 |
| | Dielectric | GL102F | 0.025 |
| 13 | GND | Copper | 0.015 |
| | Dielectric | GL102F | 0.025 |
| Bottom | GND | Copper | 0.015 |
| | Solder Mask | SR-1 | 0.018 |

Table 2 describes the different layers of the embodiment of the mounting substrate 402 including package number, material type, material, and thickness of each layer in this embodiment. Each of the package stack tiers can include an insulation sub-layer and a conductive sub-layer. The package stack tiers are printed circuit board layers with an insulating portion supporting a conductive trace layer for signal traces, power traces, and ground traces. The layers are combined to form a printed circuit board that can be used to direct signals and power within an electronic package. In an embodiment, each of the layers can include a dielectric layer 450 and metal conductor layer 452.

The mounting substrate 402 can be formed in a variety of ways. In some embodiments, a core layer 426 can be provided as the starting point of the mounting substrate 402. The additional layers can be formed in pairs on both sides of the mounting substrate 402. In other embodiments, the core layer 426 can have additional layers formed on only one side.

In some embodiments, the core layer 426 can be a rigid base material laminated with a conductive layer on one or both sides, such as copper, copper alloys, metal, or other conductive materials. The base material can include a variety of materials such epoxy resins like halogen free Bismaleimide Triazin (BT) thermoset resin such as HL832 BNSF LCA.

The core layer 426 can include core vias 424. The core vias 424 are vertical interconnects electrically connecting the top and bottom sides of the core layer 426. The core vias 424 can be configured to provide signals, power, or ground connections between layers.

In another embodiment, the mounting substrate 402 can be configured to include the layers can be configured as shown in Table 2. The mounting substrate 402 can also include a set of top layers 428 and a set of bottom layers 429 separated by the core layer 426.

The top layers 428 can include package stack having a first layer 410, a second layer 412, a third layer 414, a fourth layer 416, a fifth layer 418, a sixth layer 420, and a seventh layer 422. The layers can be configured as shown in Table 2. In some configurations, the layers can be configured as having a dielectric layer 450 and the metal conductor layer 452. In some embodiments, the layer directly on or adjacent to the core layer, such as the seventh layer 422, can use the core layer 426 as the dielectric layer 450. The layers, such as the layers of a printed circuit board, a package board, or other similar structures, are numbered as an example to show the multilayer structure.

The bottom layers 429 can include an eighth layer 430, a ninth layer 432, a tenth layer 434, an eleventh layer 436, a twelfth layer 438, a thirteenth layer 440, and a fourteenth layer 442. The layers can be configured as shown in Table 2.

The layers can be interconnected with conductive vias 408. The conductive vias 408 are vertical interconnections that can form conductive links between two or more layers for providing signals, power, or ground connections. The core layer 426 can be thicker than other layers. The core layer 426 can include core vias 424 that can be larger than other vias. For example, the core vias 424 can have a diameter of 100 microns and have a via pad of 200 microns. Regular sized ones of the conductive vias 408 can have a 65-micron diameters and have a 95-micron pad size.

In the manufacturing process, the layers can be formed from the core layer 426 outward by forming a new layer on either side of the core layer 426. The core layer 426 can be flipped over as needed to form the new layers. Thus, the seventh layer 422 and the eighth layer 430 can be formed on the core layer 426. The two layers can have the same or different configurations as needed. The process can continue by forming the sixth layer 420 on the seventh layer 422 and forming the ninth layer 432 on the eighth layer 430.

These formation operations can continue with the fifth layer 418 formed on the sixth layer 420, the fourth layer 416 formed on the fifth layer 418, the third layer 414 formed on the fourth layer 416, the second layer 412 formed on the third layer 414, and the first layer 410 formed on the second layer 412.

The first layer 410 can have mounting bumps 404 on a top side. The mounting bumps 404 can be metallic connectors for attaching electronic devices. The mounting bumps 404 can be formed from materials such as solder, copper, or other conductive materials.

In some embodiments, the lower layers can be formed in sync with the top layers 428. The tenth layer 434 can be formed on the ninth layer 432, the eleventh layer 436 can be formed on the tenth layer 434, the twelfth layer 438 can be formed on the eleventh layer 436, the thirteenth layer 440 can be formed on the twelfth layer, and the fourteenth layer 442 can be formed on the thirteenth layer 440.

The bottommost layer, such as the fourteenth layer 442 can be attached to solder balls 444 that can be used to attach the mounting substrate 402 to an external system, such as a device printed circuit board or other system component.

The numbers of the layers are for an exemplary embodiment, but other layer configuration can be used. Depending on the particular embodiments, the mounting substrate 402 can be formed with only the top layers 428, only the bottom layers 429, or both sets of layers. The mounting substrate 402 can include one or more of the mesh structures 380, such as one of the mesh structure 380 in the top layers 428, one of the mesh structure 380 in the bottom layers 429, or the mesh structures 380 in both the top layers 428 and the bottom layers 429. In some embodiments, the number of cross mesh layers in each of the mesh structure 380 can be the same or different.

In some embodiments, the thickness of the conductive layers can vary from layer to layer. For example, the power layers can be configured with a thicker conductive layer than the signal layers. Thus, the mesh layers can have thicker layers to enable higher power levels and current flow.

FIGS. 5A,5B, 5C, 5D, and 5E illustrate embodiments of a mesh layer 502 having different types of strips 504. The mesh layer 502 can include horizontal, vertical, or angled strips 508. For example, the mesh layer 502 can be a vertical mesh layer 506 having a plurality of strips 508. The strips 508 can be electrical conductors or traces positioned on an insulating portion of the layer. The mesh layer 502 can be combined with another one of the mesh layer 502 having a different orientation to form the mesh structure 380. The layers, such as the mesh layer 502, can be one of the layers of the mounting substrate 304 or a printed circuit board. Each of the layers can have a different functionality such as signal conducting, providing power connections, providing ground connections, shielding, or other similar functionality. In some embodiments, the layers can provide a structure for attaching electronic components such as chips, passive components, and/or active components. The layer can include the traces, pads, vias, openings, and other conductive elements. The naming and numbering of the layers can be for identifying multiple layers that can have different functionality.

Figure 5A:
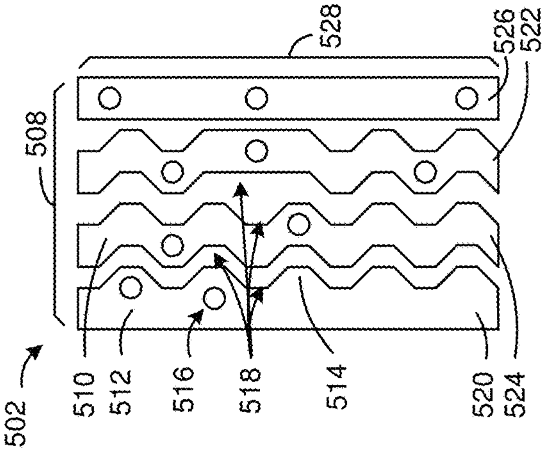
FIG. 5A depicts an example of an embodiment of a mesh layer.

FIG. 5A illustrates an embodiment of the mesh layer 502. The mesh layer 502 of the mounting substrate 304 can include the one or more strips 508 arranged with power strips 510 and ground strips 512. The power strips 510 and the ground strips 512 can have strip protrusions 514 extending from the sides of the strips 508 and extending into the area between the power strips 510 and the ground strips 512. The mesh layer 502 can be one of the layers of the mounting substrate 304 or a printed circuit board.

The strip protrusions 514 are extensions of the strips 508. The strip protrusions 514 can extend toward adjacent ones of the strips 508. The strip protrusions 514 extend outward away from the long axis of one of the strips 508. The strip protrusions 514 can be formed from the same material as the strips 508. The strip protrusions 514 can extend orthogonally from the strips 508.

The strip protrusions 514 can have a variety of configurations. The strip protrusions 514 can have different shapes including square, rectangular, triangular, trapezoidal, parallelogram, rhombus, rounded, or other similar shapes.

The corners of the strip protrusions 514 can treated to reduce sharp corners. The corners can be chamfered, beveled, canted, or rounded. The treated corners can be formed by etching, ablation, photolithographic processes, or other similar techniques. Reducing the sharp corners or edges can improve the electromagnetic properties of the strips 508.

The strip protrusions 514 can form protrusion gaps 518. The protrusion gaps 518 are indentations between two of the strip protrusions 514. The protrusion gaps 518 can be partially filled with one of the strip protrusions 514 of an adjacent one of the strips 508.

In some embodiments, the strip protrusions 514 can have one or more conductive vias 516 located within strip protrusion 514. The conductive vias 516 can be conductor filled opening between two of the layers. The conductive vias 516 can form an electrical circuit loop with other of the strips 508 of another layer.

The conductive vias 516 can have a variety of configurations. In some embodiments, the conductive vias 516 can be located on adjacent ones of the strip protrusions 514 on adjacent strips 508 to reduce the distance between the conductive vias 514.

The conductive vias 516 can be positioned on the strip protrusions 514 in different locations. For example, the conductive vias 516 can be positioned in the center, side, front, or back of the strip protrusion 514. In some embodiments, a plurality of the conductive vias 516 can be on one of the strip protrusions 514.

In an exemplary embodiment, the mesh layer 502 can be configured with alternating power and ground strips. The mesh layer 502 can include a first ground strip 520, a first power strip 524, a second ground strip 522, and a second power strip 526. The strips 508 can have the strip protrusions 514 on one or both sides of the strips 508. The strips 508 can be oriented with the long axis in a vertical orientation, a horizontal orientation, or oriented at any angle.

The first ground strip 520 can be positioned at one edge of the mesh layer 502. The first ground strip 520 can have one long side with no protrusions and an opposite side with the strip protrusions 514 extending between the first ground strip 520 and the first power strip 524. The first ground strip 520 can have the strip protrusions 514 with a trapezoidal shape.

The first ground strip 520 can have conductive vias 516 positioned within some of the strip protrusions 514. The conductive vias 516 can be electrically coupled to other layers to form circuit loops.

The first power strip 524 can have the strip protrusions 514 on both sides along the long axis of the first power strip 524. The strip protrusions 514 can be configured to be directly opposite of the protrusion gaps 518 of the first power strip 524.

In some configurations, the first ground strip 520 and the first power strip 524 can have the strip protrusions 514 that are adjacent and extending into the area between the strips 508. The strip protrusions 514 that are adjacent can have conductive vias 516. Because the strip protrusions 514 extend into the area between the strips 508, the distance between the conductive vias 516 can be reduced and the mutual inductance can be increased.

The second ground strip 522 can have the strip protrusions 514 on both sides along the long axis of the second group strip 522. The strip protrusions 514 can be configured in an alternating pattern on opposite sides of the second ground strip 522.

The strip protrusions 514 can have a variety of configurations. The second ground strip 522 can be configured to have a series of the strip protrusions 514 with one of the protrusion gaps 518 extending across one or more of the strip protrusions 514. The protrusion gap 518, such as an extended protrusion gap, can have one or more of the strip protrusions 514 facing the extended protrusion gap.

The second power strip 526 can have a variety of configurations. The second power strip 526 can be configured with zero, one, or two long sides with strip protrusions 514.

The second power strip 526 can have one or more of the conductive vias 516 within the boundaries of the body of the strip. The conductive vias 516 can have different positions within the boundaries of the strips 508. For example, the conductive vias 516 can be positioned at the left edge, the right edge, or the center of the strips 508.

Figure 5B:
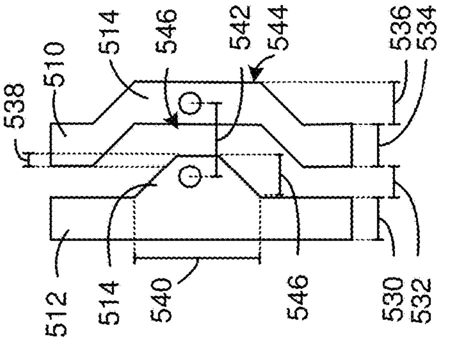
FIG. 5B depicts an example of an embodiment of strip protrusions configuration.

FIG. 5B illustrates an embodiment of the strip protrusions 514 configuration. The strip protrusions 514 can extend toward adjacent ones of the strips 508. The strip protrusions 514 can be included in the mesh layer 502. The mesh layer 502 can be one of the layers of the mounting substrate 304 or a printed circuit board.

In different embodiments, the strip protrusions 514 can have different dimensions. For example, the strip protrusions 514 can have a protrusion lengths 540 and a protrusion width 546. The protrusion length 540 can be the length of the protrusion 514 along the long axis of one of the strips 508 as it extends outward from the body of one of the strips 508. The protrusion width 546 can be the distance the protrusion extends outward from one of the strips 508.

The ground strips 512 can have a ground strip width 530 and a ground strip length 528. The strip protrusion 514 can extend outward beyond the ground strip width 530. The total width of one of the strips 508 can be the sum of the ground strip width 530 and the protrusion width 546.

The power strip 510 can have a variety of configurations. The power strip 510 can be configured with an extended protrusion 544. The extended protrusion 544 can have a portion that extends outward from the body of the power strip 510. The extended protrusion 544 can be sized to extend over and around one of the strip protrusions 514 of an adjacent one of the strips 508, such as the ground strip 512. The extended protrusion 544 can include an extended gap 546 that can be sized to accommodate one of the strip protrusions 514 of an adjacent one of the strips 508.

The power strip 510 can have a power strip width 534 along one of the short sides of the power strip 510. The extended protrusion 544 of the power strip 510 can have an extended protrusion width 536. The extended protrusion width 536 is the width of the extended protrusion 544.

The power strip 510 can have one or more of the conductive vias 516 in the extended protrusion 514 that is adjacent to the strip protrusion 514 of the ground strip 512. The conductive vias 516 are separated by a via separation distance 542. The via separation distance 542 is the distance between two of the conductive vias 516. The via separation distance 542 can be measured in a variety of ways including center to center, edge to edge, or nearest adjacent edges, or other similar techniques.

The separation between the ground strip 512 and the power strip 510 is the strip separation 532. This can also be known as the strip pitch. The strip separation 532 can be symmetric or asymmetric and have different separation values.

The strip protrusions 514 and the protrusion gaps 518 can have a variety of configurations. For example, the strips protrusions 514 can be positioned relative to one of the protrusion gaps 518 such that one of the strip protrusions 514 can extend into the area of one of the protrusion gaps 518. The strip protrusion 514 can extend a distance by a protrusion overlap 538 distance.

The protrusion overlap 538 can have different values in different configurations. For example, the protrusion overlap 538 can be a positive value when one of the strip protrusions 514 and one of the protrusion gaps 518 overlap, a negative value when they do not overlap are offset from one another, and zero when they are positioned directly next to one another without an overlap or offset.

The position of the strip protrusion 514 and the protrusion gap 518 can directly impact the location of the conductive vias 516 and the via separation distance 542. The via separation distance 542 can be reduced by moving the strips 508 closer together which can improve the mutual inductance of the loop formed by the conductive vias 516, the strips 508, and other components of the circuit.

In some embodiments, the ground strip width 530 can be equal to the power strip width 534. In other embodiments, the group strip width 530 can be different from the power strip width 534.

Figure 5C:
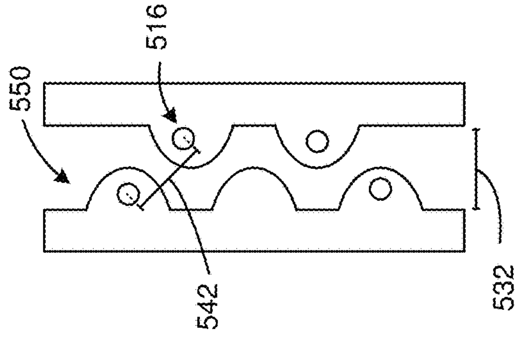
FIG. 5C depicts an example of an embodiment of strip protrusions.

FIG. 5C illustrates another embodiment of the strip protrusions 514 with a protrusion shape 550 that is rounded. The strip protrusions 514 can have the conductive vias 516 positioned within boundaries of the strip protrusions 514. The strip protrusions 514 can be included in the mesh layer 502. The mesh layer 502 can be one of the layers of the mounting substrate 304 or a printed circuit board.

The protrusion shape 550 can allow two of the conductive vias 516 to be positioned closer together than a configuration with only a linear configuration of the strips 508 with the strip separation 532 and without the strip protrusions 514. Because the strip protrusions 514 extend into the area between two of the strips 508, the conductive vias 516 on those strip protrusions 514 can be positioned closer together at the via separation distance 542 and can increase the mutual induction for improved performance.

Figure 5D:
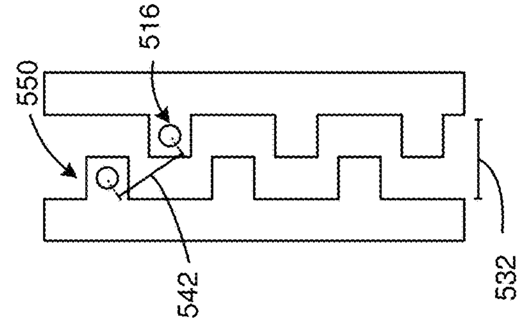
FIG. 5D depicts an example of another embodiment of strip protrusions.

FIG. 5D illustrates another embodiment of the strip protrusions 514 with a protrusion shape 550 that is square. The strip protrusions 514 can have the conductive vias 516 positioned within boundaries of the strip protrusions 514. The strip protrusions 514 can be included in the mesh layer 502. The mesh layer 502 can be one of the layers of the mounting substrate 304 or a printed circuit board.

The protrusion shape 550 can allow two of the conductive vias 516 to be positioned closer together than a configuration with only a linear configuration of the strips 508 with the strip separation distance 532 and without the strip protrusions 514. Because the strip protrusions 514 extend into the area between two of the strips 508, the conductive vias 516 on those strip protrusions 514 can be positioned closer together at the via separation distance 542 and can increase the mutual induction for improved performance.

Figure 5E:
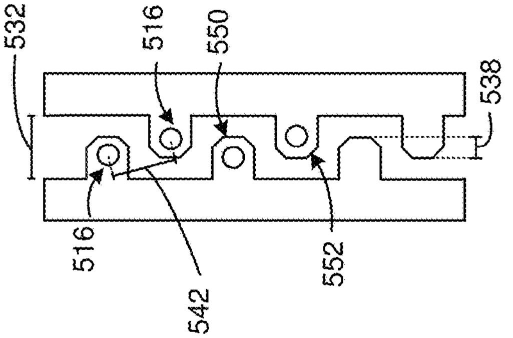
FIG. 5E depicts an example of yet another embodiment of strip protrusions.

FIG. 5E illustrates yet another embodiment of one of the strip protrusions 514. The strip protrusions 514 can have the protrusion shape 550 that is square with chamfered corners 552. The strip protrusions 514 can have the conductive vias 516 positioned within boundaries of the strip protrusions 514. The strip protrusions 514 can be included in the mesh layer 502. The mesh layer 502 can be one of the layers of the mounting substrate 304 or a printed circuit board.

The protrusion shape 550 can have chamfered corners to help smooth the shape and improve electrical performance. The chamfered corners 552 are sharp corners that are flattened. The flattening action can be performed during manufacture or after. The chamfered corners 552 can be formed by etching, photolithography, post processing, laser trimming, or other similar techniques.

The protrusion shape 550 can allow two of the conductive vias 516 to be positioned closer together than a configuration with only a linear configuration of the strips 508 with the strip separation distance 532 and without the strip protrusions 514. Because the strip protrusions 514 extend into the area between two of the strips 508, the conductive vias 516 on those strip protrusions 514 can be positioned closer together at the via separation distance 542 and can increase the mutual induction for improved performance. The protrusion overlap 538 represents the distance the two elements overlap.

In some embodiments, the strip protrusions 514 can be positioned to for an interlocking configuration with the strip protrusion 514 of one of the strips 508 overlapping the protrusion gap 518 of the other one of the strips 508. Using the interlocking configuration can help reduce the via separation distance 542 to improve the mutual inductance and increase performance. The interlocking configuration can also reduce the strip separation distance 532.

Figure 6A:
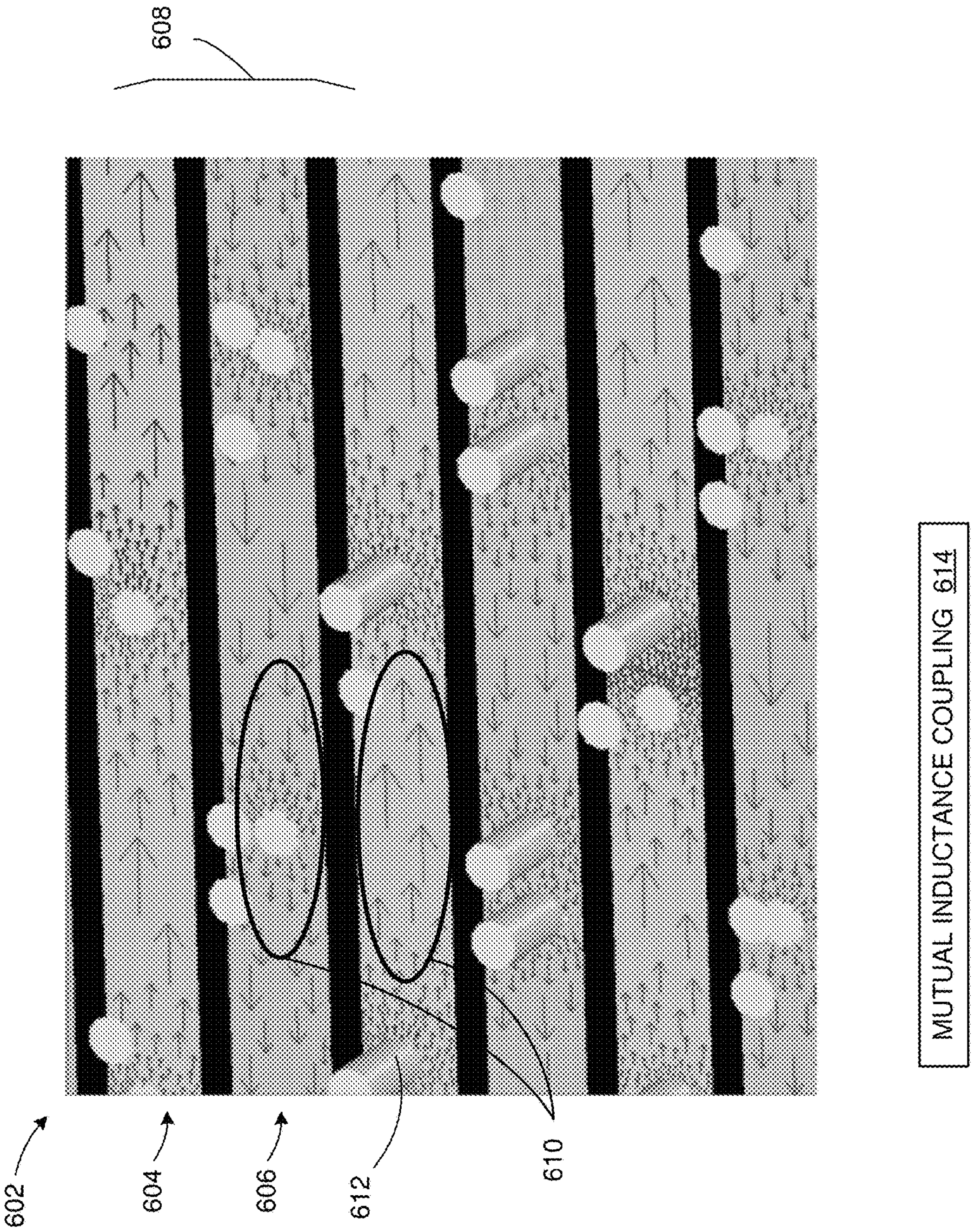
FIG. 6A depicts an example of a current flow of the strips of a horizontal mesh layer.

FIG. 6A illustrates an example of the current flow 610 of the strips 608 of a horizontal mesh layer 602 in an embodiment. The horizontal mesh layer 602 can be configured to operate with power flowing in different directions in adjacent alternating power strips 604 and ground strips 606.

In some embodiments, the horizontal mesh layer 602 can be configured so that the current flow of the ground strips 606 and the power strips 604 flow in opposite directions. The opposite current flow 610 in the adjacent pairs of the ground strips 606 and the power strips 604 can improve the mutual inductance coupling 614 between the adjacent alternate strips. The mutual inductance coupling 614 can represent the degree of the mutual inductance between two conductors.

Current is the flow of electrons through a conductor. Because electrons have a negative charge, the current flow 610 is in the opposite direction as the electron flow. Current flows from the positive side to the negative side of a circuit, while electrons flow from the negative side to the positive side of a circuit.

The strips 608 of the horizontal mesh layer 602 can be coupled to other layers of the mounting substrate 304 with vertical interconnects 612. The vertical interconnects 612, such as through board vias, can electrically couple the strips 608 with the power or ground. The current flow 610 can go between layers through the vertical interconnects 612. The current flow 610 can be seen entering and existing from the vertical interconnects 612.

Figure 6B:
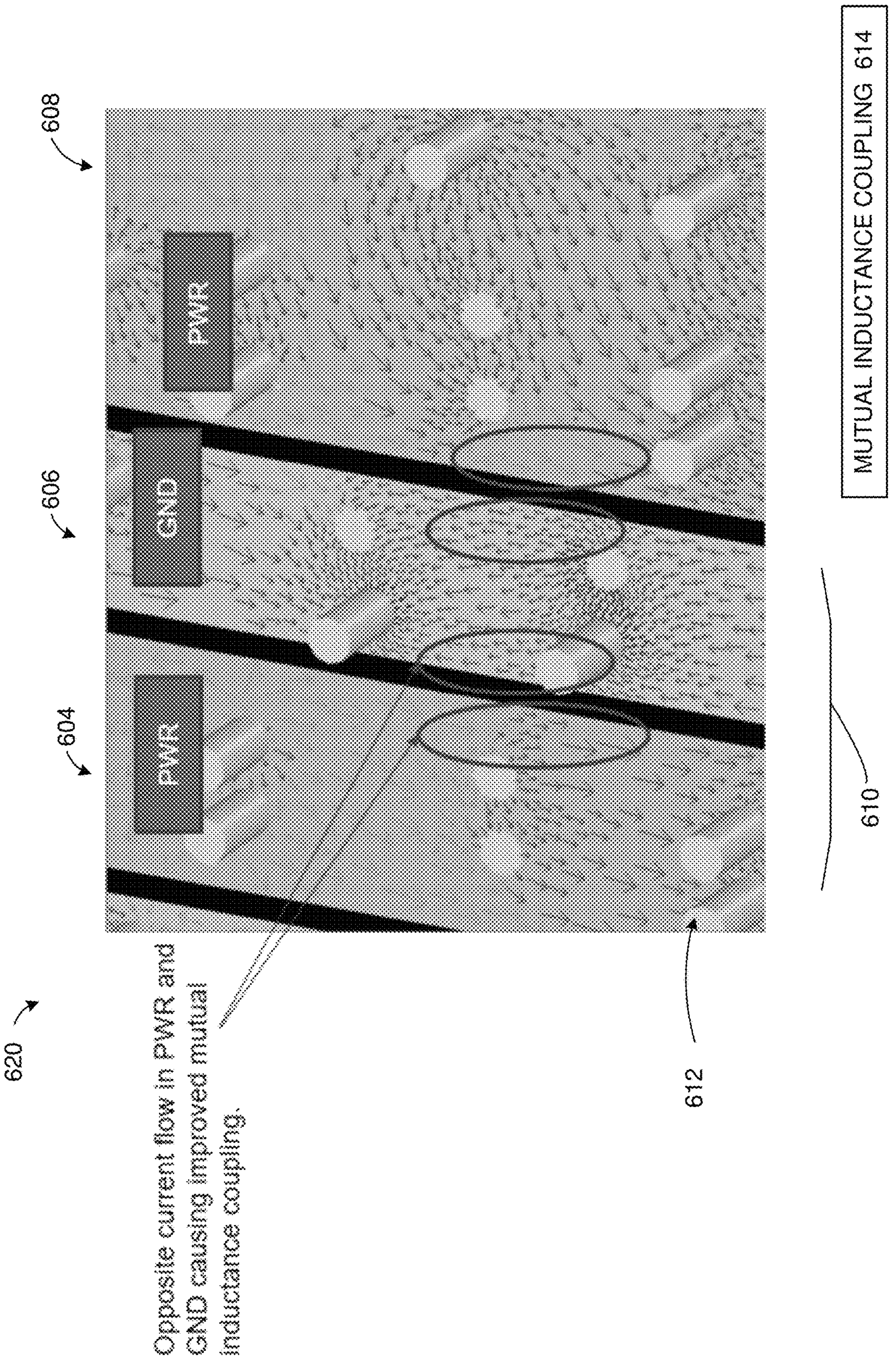
FIG. 6B depicts an example of a current flow of the strips of a vertical mesh layer.

FIG. 6B illustrates an example of the current flow 610 of the strips 608 of a vertical mesh layer 620 in an embodiment. The vertical mesh layer 620 can be configured to operate with power flowing in different directions in adjacent alternating power strips 604 and ground strips 606.

In some embodiments, the vertical mesh layer 620 can be configured so that the current flow 610 of the ground strips 606 and the power strips 604 flow in opposite directions. The opposite current flow 610 in the adjacent pairs of the ground strips 606 and the power strips 604 can improve the mutual inductance coupling 614 between the adjacent alternate strips. The mutual inductance coupling 614 can represent the degree of the mutual inductance between two conductors.

The strips 608 of the vertical mesh layer 620 can be coupled to other layers of the mounting substrate 304 with vertical interconnects 612. The vertical interconnects 612, such as through board vias, can electrically couple the strips 608 with the power or ground.

3.0. PERFORMANCE ANALYSIS

Figure 7:
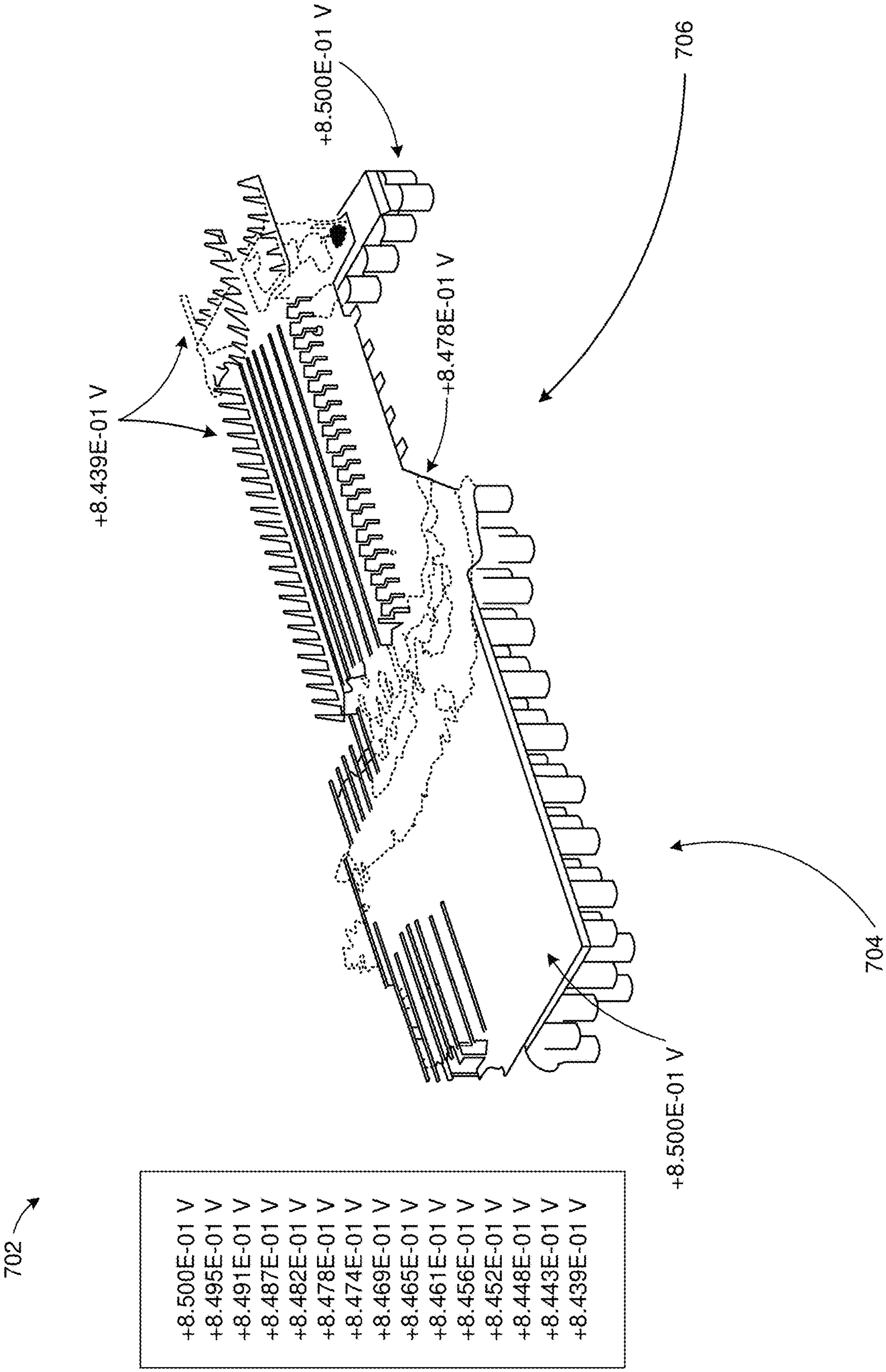
FIG. 7 depicts an example of a voltage drop diagram for an embodiment of the electronic system.

FIG. 7 illustrates an example of a voltage drop diagram 702 for an embodiment of the electronic system 100. The voltage drop diagram 702 shows the results of the direct current internal resistance (DCIR) simulation.

The diagram shows that the structure shows only 0.0061 volt drop out of a 0.85-volt supply. The distribution of the voltage drop is even as indicated on the diagram by a first region 704 and a second region 706.

Figure 8:
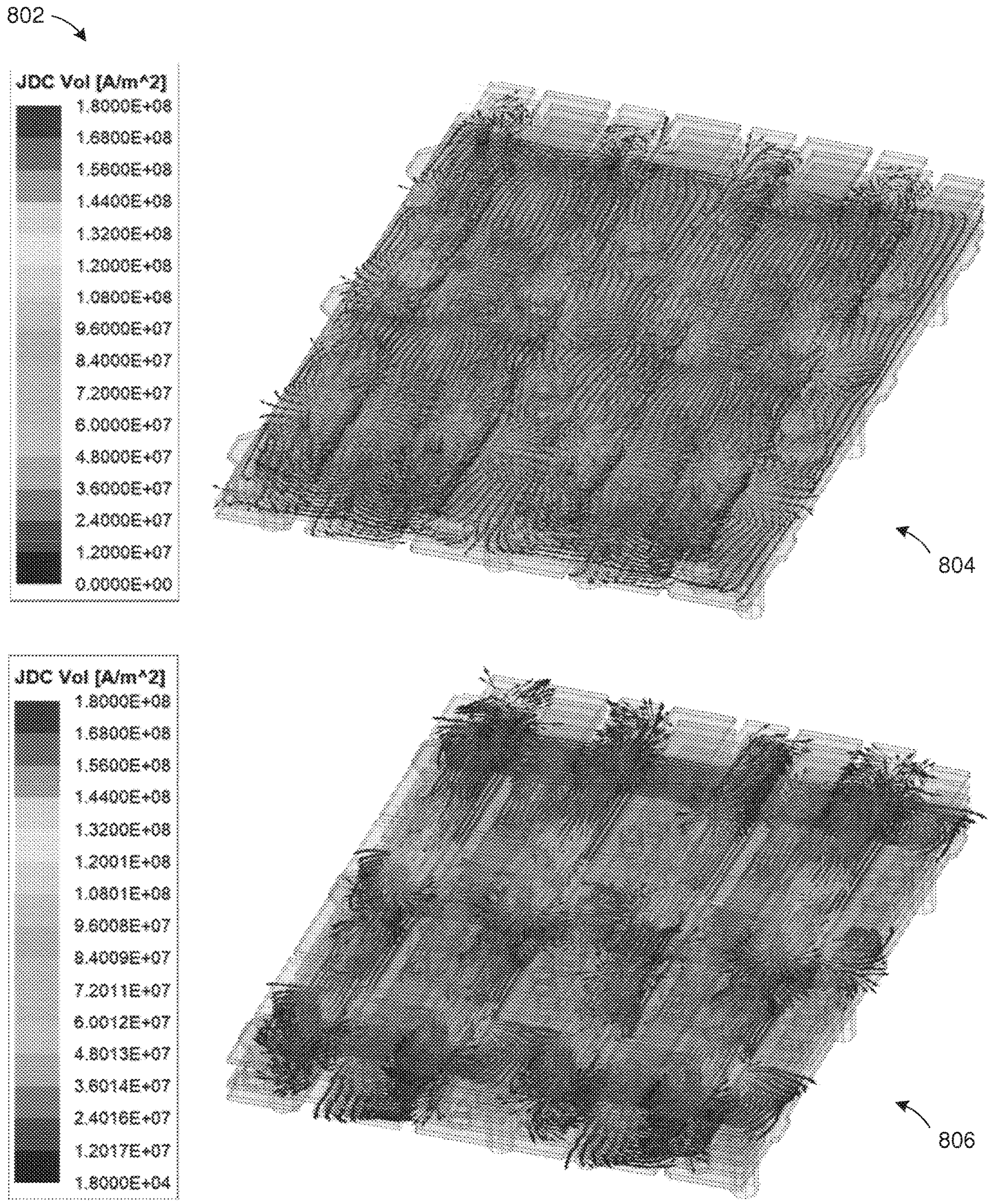
FIG. 8 depicts an example of a DC current density comparison diagram for embodiments of the electronic system.

FIG. 8 illustrates an example of a DC current density comparison diagram 802 for two embodiments of the electronic system 100. A non-cross-mesh wireframe embodiment 804 can show the current density map of a portion of a power distribution layer using power and ground planes. A cross-mesh wireframe embodiment 806 can show the current density of a portion of a cross-mesh structure. The current density of both embodiments show similar current distributions. This can indicate that the cross-mesh embodiment has equally good DC performance as the planar power structures.

4.0. FUNCTIONAL OVERVIEW

Figure 9:
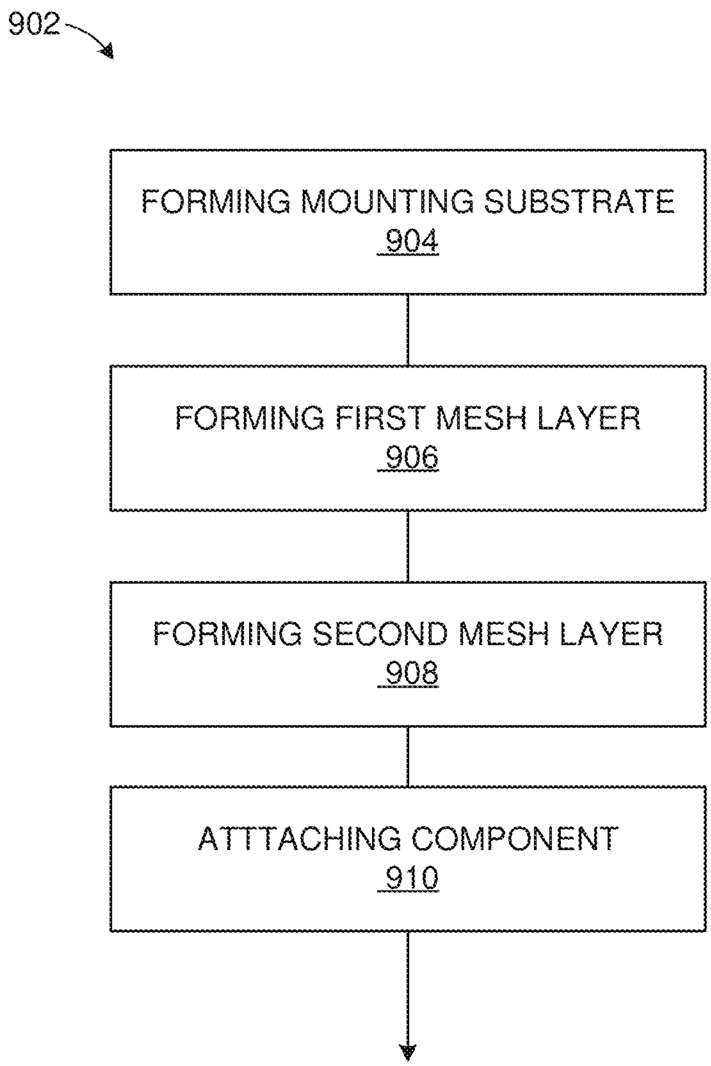
FIG. 9 depicts an example of a manufacturing process flow for the electronic system in an embodiment.

FIG. 9 illustrates an example of a manufacturing process flow 902 for the electronic system 100 in an embodiment. The manufacturing process flow 902 can describe the steps and process for manufacturing the electronic package 102, the PCB 108, and attaching the two elements together.

The manufacturing process flow 902 can include a variety of operations. In an illustrative embodiment, the process flow 902 can include a forming mounting substrate step 904, a forming first mesh layer step 906, a forming second mesh layer step 908, and an attaching package step 910.

In the forming mounting substrate step 904, the initial portions of the electronic package 102 can be formed including a bottom layer 318. The bottom layer 318 of the mounting substrate 304 can provide the interface to external components via the bottom connectors.

In the forming first mesh layer step 906, the first mesh layer 309 can be formed over the bottom layer 318. The first mesh layer 309 can have a different relative numbering scheme than above. The first mesh layer 309 can include a set of power strips 126 and ground strips 128 arranged in an alternating order with one of the power strips 126 adjacent to the next group strip 128.

In the forming second mesh layer step 908, the second mesh layer 308 can be formed over the first mesh layer 309 and be set at mesh angle 383 from the first mesh layer 309. In one embodiment, the mesh angle 383 can be 90 degrees so the two mesh layers are orthogonal. In other embodiments, the mesh angle 383 can be range from 0 degrees to 180 degrees.

After the first and second mesh layers have been formed, additional layers can be added above the layers as needed to accommodate the functional needs of the system. This can include the top layer 316 which can have mounting pads 132 for attaching external components.

In the attaching component step 910, the electronic component 305, such as a ball grid array component, can be attached to the mounting pads 132 on the top layer 316. In other embodiments, the electronic component and the mounting substrate 304 can form a flip chip package.

Other examples of these and other embodiments are found throughout this disclosure.

5.0. EXAMPLE EMBODIMENTS

Examples of some embodiments are represented, without limitation, in the following clauses and use cases:

According to an embodiment, a method of manufacture of an electronic system comprises forming a mounting substrate having a plurality of layers, the mounting substrate having at least a bottom layer and a top layer; forming a first mesh layer over the bottom layer, the first mesh layer having a plurality of power strips and a plurality of ground strips arranged in parallel with a long axis of the power strips of the first mesh layer; and forming a second mesh layer over the first mesh layer, the second mesh layer having a plurality of power strips and ground strips arranged in parallel with a long axis of the power strips of the second mesh layer, and the second mesh layer at a mesh angle to the first mesh layer; and wherein each of the power strips and the ground strips alternating with one another, the power strips and ground strips having current flows in opposite directions for reducing the loop inductance.

In an embodiment, the method wherein forming the mounting substrate includes forming a signal layer over the second mesh layer, the signal layer having signal traces coupled to a trace on another layer.

In an embodiment, the method wherein forming the mounting substrate includes forming a vertical interconnect between two or more layers.

In an embodiment, the method wherein forming the second mesh layer includes forming the second mesh layer orthogonal to the first mesh layer with a mesh angle of 90 degrees.

In an embodiment, the method wherein forming the second mesh layer includes forming second mesh layer having an odd strip configuration with a first strip as a power strip.

According to an embodiment, a method of manufacture of an electronic system comprises forming a printed circuit board having a plurality of layers, the printed circuit board having a bottom layer and a top layer, the top layer having contact bumps exposed on the top side for attaching to an electronic component; forming a first mesh layer over the bottom layer, the first mesh layer having a plurality of power strips and a plurality of ground strips arranged in parallel with a long axis of the power strips of the first mesh layer; and forming a second mesh layer over the first mesh layer, the second mesh layer having a plurality of power strips and ground strips arranged in parallel with a long axis of the power strips of the second mesh layer, and the second mesh layer at a mesh angle to the first mesh layer; and wherein each of the power strips and the ground strips alternating with one another, the power strips and ground strips having current flows in opposite directions for reducing the loop inductance.

In an embodiment, the method further comprises attaching an electronic component to the contact bumps on the top side of the printed circuit board.

In an embodiment, the method wherein forming the second mesh layer includes forming second mesh layer having an even strip configuration with a second strip configured as a power strip.

In an embodiment, the method wherein forming the second mesh layer includes forming second mesh layer having a mesh angle larger than 0 degrees but less than 180 degrees.

In an embodiment, the method wherein forming the first mesh layer includes forming the first mesh layer having one of the power strips with a strip protrusion extending toward a protrusion gap of one of the ground strips and the strip protrusion electrically coupled to the second mesh layer with a conductive via.

According to an embodiment, an electronic system comprises a mounting substrate having a plurality of layers, the mounting substrate having a bottom layer and a top layer; and wherein: the mounting substrate having a first mesh layer over the bottom layer, the first mesh layer having a plurality of power strips and a plurality of ground strips arranged in parallel with a long axis of the power strips of the first mesh layer; and the mounting substrate having a second mesh layer over the first mesh layer, the second mesh layer having a plurality of power strips and ground strips arranged in parallel with a long axis of the power strips of the second mesh layer, and the second mesh layer at a mesh angle to the first mesh layer; and wherein each of the power strips and the ground strips alternating with one another, the power strips and ground strips having current flows in opposite directions for reducing the loop inductance.

In an embodiment, the system further comprises a signal layer over the second mesh layer, the signal layer having signal traces coupled to a trace on another layer.

In an embodiment, the system further comprises a vertical interconnect between two or more layers.

In an embodiment, the system further comprises the second mesh layer is orthogonal to the first mesh layer with a mesh angle of 90 degrees.

In an embodiment, the system further comprises the second mesh layer having an odd strip configuration with a first strip as a power strip.

In an embodiment, the system further comprises the mounting substrate is a printed circuit board and the top layer having contact bumps exposed on the top side for attaching to an electronic component.

In an embodiment, the system further comprises an electronic component attached to the contact bumps on the top side of the printed circuit board.

In an embodiment, the system further comprises second mesh layer having an even strip configuration with a second strip configured as a power strip.

In an embodiment, the system further comprises the second mesh layer having a mesh angle larger than 0 degrees but less than 180 degrees.

In an embodiment, the system further comprises one of the power strips having a strip protrusion extending toward a protrusion gap of one of the ground strips and the strip protrusion electrically coupled to the second mesh layer with a conductive via. 6.0. EXTENSIONS AND ALTERNATIVES As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being coupled to various other components by arrows. These arrows illustrate only certain examples of current flows between or through the components. Neither the direction of the arrows nor the lack of arrow lines between certain components should be interpreted as indicating the existence or absence of a flow between the certain components themselves.

In the specification, embodiments of the invention have been described with reference to numerous specific details that may vary from implementation to implementation. Thus, the sole and exclusive indicator of what is the invention and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this system, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

It is understood that the system functionality can be described using terms like module, unit, system, subsystem, pod, and component that represent devices that can be implemented using different combinations of mechanical and electronic elements. The systems and devices can include electric subsystems, mechanical subsystems, and other physical elements to operate and control the system.

These elements can include computing elements that can execute the firmware and software of the system to control mechanical features of the system. In addition, the mechanical elements of the system can operate with or without control mechanisms in regular operation.

What is claimed is:

1. A method of manufacture of an electronic system comprising:

forming a printed circuit board having a plurality of layers, the printed circuit board having a bottom layer and a top layer, the top layer having contact bumps exposed on the top side for attaching to an electronic component;

forming a first mesh layer over the bottom layer, the first mesh layer having a plurality of power strips and a plurality of ground strips arranged in parallel with a long axis of the power strips of the first mesh layer; and forming a second mesh layer over the first mesh layer, the second mesh layer having a plurality of power strips and ground strips arranged in parallel with a long axis of the power strips of the second mesh layer, and the second mesh layer at a mesh angle to the first mesh layer and wherein each of the power strips and the ground strips alternating with one another, the power strips and ground strips having current flows in opposite directions for reducing a loop inductance.

2. The method as claimed in claim 1, further comprising attaching an electronic component to the contact bumps on the top side of the printed circuit board.

3. The method as claimed in claim 1, wherein forming the second mesh layer includes forming second mesh layer having an even strip configuration with a second strip configured as a power strip.

4. The method as claimed in claim 1, wherein forming the second mesh layer includes forming second mesh layer having a mesh angle larger than 0 degrees but less than 180 degrees.

5. The method as claimed in claim 1, wherein forming the first mesh layer includes forming the first mesh layer having one of the power strips with a strip protrusion extending toward a protrusion gap of one of the ground strips and the strip protrusion electrically coupled to the second mesh layer with a conductive via.

6. An electronic system comprising:

a mounting substrate having a plurality of layers, the mounting substrate having a bottom layer and a top layer; and wherein:

the mounting substrate having a first mesh layer over the bottom layer, the first mesh layer having a plurality of power strips and a plurality of ground strips arranged in parallel with a long axis of the power strips of the first mesh layer, and the mounting substrate is a printed circuit board and the top layer having contact bumps exposed on the top side for attaching to an electronic component, and the mounting substrate having a second mesh layer over the first mesh layer, the second mesh layer having a plurality of power strips and ground strips arranged in parallel with a long axis of the power strips of the second mesh layer, and the second mesh layer at a mesh angle to the first mesh layer, and wherein each of the power strips and the ground strips alternating with one another, the power strips and ground strips having current flows in opposite directions for reducing a loop inductance.

7. The system as claimed in claim 6, further comprising an electronic component attached to the contact bumps on the top side of the printed circuit board.

8. The system as claimed in claim 6, wherein the second mesh layer having an even strip configuration with a second strip configured as a power strip.

9. The system as claimed in claim 6, wherein the second mesh layer having the mesh angle larger than 0 degrees but less than 180 degrees.

10. The system as claimed in claim 6, wherein one of the power strips having a strip protrusion extending toward a protrusion gap of one of the ground strips and the strip protrusion electrically coupled to the second mesh layer with a conductive via.

* * * * *